(12) United States Patent
Nugent

(10) Patent No.: US 7,827,130 B2
(45) Date of Patent: Nov. 2, 2010

(54) FRACTAL MEMORY AND COMPUTATIONAL METHODS AND SYSTEMS BASED ON NANOTECHNOLOGY

(75) Inventor: Alex Nugent, Santa Fe, NM (US)

(73) Assignee: Knowm Tech, LLC, Albuquerque, NM (US)

( * ) Notice: Subject to any disclaimer, the term of this patent is extended or adjusted under 35 U.S.C. 154(b) by 0 days.

(21) Appl. No.: 12/363,052

(22) Filed: Jan. 30, 2009

(65) Prior Publication Data

US 2009/0138419 A1    May 28, 2009

Related U.S. Application Data

(63) Continuation of application No. 11/269,416, filed on Nov. 7, 2005, now Pat. No. 7,502,769, which is a continuation-in-part of application No. 11/147,081, filed on Jun. 6, 2005, now Pat. No. 7,409,375, and a continuation-in-part of application No. 11/045,538, filed on Jan. 31, 2005, now Pat. No. 7,039,619.

(51) Int. Cl.
*G06E 1/00* (2006.01)
(52) U.S. Cl. .............................. 706/26; 706/20; 706/28; 706/33
(58) Field of Classification Search .................... 706/20, 706/33, 28, 26, 27
See application file for complete search history.

(56) References Cited

U.S. PATENT DOCUMENTS

| | | | |
|---|---|---|---|
| 2,707,223 | A | 4/1955 | Hollman |
| 3,222,654 | A | 12/1965 | Widrow |
| 3,833,894 | A | 9/1974 | Aviram et al. |
| 4,802,951 | A | 2/1989 | Clark et al. |
| 4,926,064 | A | 5/1990 | Tapang |
| 4,974,146 | A | 11/1990 | Works et al. |
| 4,988,891 | A | 1/1991 | Mashiko |

(Continued)

FOREIGN PATENT DOCUMENTS

EP    1 022 764 A1    1/2000

(Continued)

OTHER PUBLICATIONS

Robinson, M.E.; Yoneda, H.; Sanchez-Sinencio, E., "A modular CMOS design of a Hamming network," Neural Networks, IEEE Transactions on, vol. 3, No. 3, pp. 444-456, May 1992.*

(Continued)

*Primary Examiner*—Michael B. Holmes
*Assistant Examiner*—David H Kim
(74) *Attorney, Agent, or Firm*—Kermit D. Lopez; Luis M. Ortiz; Ortiz & Lopez, PLLC

(57) ABSTRACT

Fractal memory systems and methods include a fractal tree that includes one or more fractal trunks. One or more object circuits are associated with the fractal tree. The object circuit (s) can be configured from a plurality of nanotechnology-based components to provide a scalable distributed computing architecture for fractal computing. Additionally, a plurality of router circuits is associated with the fractal tree, wherein one or more fractal addresses output from a recognition circuit can be provided at a fractal trunk by the router circuits.

3 Claims, 24 Drawing Sheets

U.S. PATENT DOCUMENTS

| | | | |
|---|---|---|---|
| 5,315,162 A | 5/1994 | McHardy et al. |
| 5,422,983 A | 6/1995 | Castelaz et al. |
| 5,475,794 A | 12/1995 | Mashiko |
| 5,589,692 A | 12/1996 | Reed |
| 5,649,063 A | 7/1997 | Bose |
| 5,670,818 A | 9/1997 | Forouhi |
| 5,706,404 A | 1/1998 | Colak |
| 5,717,832 A | 2/1998 | Steimle et al. |
| 5,761,115 A | 6/1998 | Kozicki et al. |
| 5,783,840 A | 7/1998 | Randall et al. |
| 5,812,993 A | 9/1998 | Ginosar et al. |
| 5,896,312 A | 4/1999 | Kozicki et al. |
| 5,904,545 A | 5/1999 | Smith et al. |
| 5,914,893 A | 6/1999 | Kozicki et al. |
| 5,951,881 A | 9/1999 | Rogers et al. |
| 5,978,782 A | 11/1999 | Neely |
| 6,026,358 A | 2/2000 | Tomabechi |
| 6,084,796 A | 7/2000 | Kozicki et al. |
| 6,128,214 A | 10/2000 | Kuekes et al. |
| 6,245,630 B1 | 6/2001 | Ishikawa |
| 6,248,529 B1 | 6/2001 | Connolly |
| 6,256,767 B1 | 7/2001 | Kuekes et al. |
| 6,282,530 B1 | 8/2001 | Huang |
| 6,294,450 B1 | 9/2001 | Chen et al. |
| 6,314,019 B1 | 11/2001 | Kuekes et al. |
| 6,330,553 B1 | 12/2001 | Uchikawa et al. |
| 6,335,291 B1 | 1/2002 | Freeman |
| 6,339,227 B1 | 1/2002 | Ellenbogen |
| 6,359,288 B1 | 3/2002 | Ying et al. |
| 6,363,369 B1 | 3/2002 | Liaw et al. |
| 6,383,923 B1 | 5/2002 | Brown et al. |
| 6,389,404 B1 | 5/2002 | Carson et al. |
| 6,407,443 B2 | 6/2002 | Chen et al. |
| 6,418,423 B1 | 7/2002 | Kambhatla et al. |
| 6,420,092 B1 | 7/2002 | Yang et al. |
| 6,422,450 B1 | 7/2002 | Zhou et al. |
| 6,423,583 B1 | 7/2002 | Avouris et al. |
| 6,424,961 B1 | 7/2002 | Ayala |
| 6,426,134 B1 | 7/2002 | Lavin et al. |
| 6,536,106 B1 | 3/2003 | Jackson et al. |
| 6,620,346 B1 | 9/2003 | Schulz et al. |
| 6,798,692 B2 | 9/2004 | Kozicki et al. |
| 6,855,329 B1 | 2/2005 | Shakesheff et al. |
| 6,889,216 B2 | 5/2005 | Nugent |
| 6,995,649 B2 | 2/2006 | Nugent |
| 7,028,017 B2 | 4/2006 | Nugent |
| 7,039,619 B2 | 5/2006 | Nugent |
| 7,107,252 B2 | 9/2006 | Nugent |
| 2001/0004471 A1 | 6/2001 | Zhang |
| 2001/0023986 A1 | 9/2001 | Mancevski |
| 2001/0024633 A1 | 9/2001 | Lee et al. |
| 2001/0031900 A1 | 10/2001 | Margrave et al. |
| 2001/0041160 A1 | 11/2001 | Margrave et al. |
| 2001/0044114 A1 | 11/2001 | Connolly |
| 2002/0001905 A1 | 1/2002 | Choi et al. |
| 2002/0004028 A1 | 1/2002 | Margrave et al. |
| 2002/0004136 A1 | 1/2002 | Gao et al. |
| 2002/0030205 A1 | 3/2002 | Varshavsky |
| 2002/0075126 A1 | 6/2002 | Reitz et al. |
| 2002/0086124 A1 | 7/2002 | Margrave et al. |
| 2002/0090468 A1 | 7/2002 | Goto et al. |
| 2002/0102353 A1 | 8/2002 | Mauthner et al. |
| 2003/0031438 A1 | 2/2003 | Kambe et al. |
| 2003/0177450 A1* | 9/2003 | Nugent ............ 716/1 |
| 2003/0236760 A1 | 12/2003 | Nugent |
| 2004/0039717 A1 | 2/2004 | Nugent |
| 2004/0150010 A1 | 8/2004 | Snider |
| 2004/0153426 A1 | 8/2004 | Nugent |
| 2004/0162796 A1 | 8/2004 | Nugent |
| 2004/0193558 A1 | 9/2004 | Nugent |
| 2007/0291524 A1 | 12/2007 | Davis et al. |

FOREIGN PATENT DOCUMENTS

| | | |
|---|---|---|
| EP | 1 046 613 A2 | 4/2000 |
| EP | 0 989 579 A3 | 3/2001 |
| EP | 1 100 106 A2 | 5/2001 |
| EP | 1 069 206 A2 | 7/2001 |
| EP | 1 115 135 A1 | 7/2001 |
| EP | 1 134 304 A2 | 9/2001 |
| RU | 2071126 C1 | 12/1996 |
| WO | WO 00/44094 | 7/2000 |
| WO | WO 03/017282 A1 | 2/2003 |

OTHER PUBLICATIONS

Gordon, D. 1987. Efficient embeddings of binary trees in VLSI arrays. IEEE Trans. Comput. 36, 9 (Sep. 1987), 1009-1018.*

Demosthenous, A.; Smedley, S.; Taylor, J., "A CMOS analog winner-take-all network for large-scale applications ," Circuits and Systems I: Fundamental Theory and Applications, IEEE Transactions on , vol. 45, No. 3, pp. 300-304, Mar. 1998.*

Bein, W.W.; Larmore, L.L.; Shields, C., Jr.; Sudborough, I.H., "Fixed layer embeddings of binary trees," Parallel Architectures, Algorithms and Networks, 2002. I-SPAN '02. Proceedings. International Symposium on , vol., no., pp. 248-253, 2002.*

Demosthenous, A.; Smedley, S.; Taylor, J., "A CMOS analog winner-take-all network for large-scale applications ," Circuits and Systems I: Fundamental Theory and Applications, IEEE Transactions on, vol. 45, No. 3, pp. 300-304, Mar. 1998.*

Addison, Paul. Fractals and Chaos: An illustrated Course, Copy-Book Publishing, Gloucester, 2001.*

Nugent, A.; Kenyon, G.; Porter, R.; , "Unsupervised adaptation to improve fault tolerance of neural network classifiers," Evolvable Hardware, 2004. Proceedings. 2004 NASA/DoD Conference on , vol., no., pp. 146-149, Jun. 24-26, 2004.*

Peter Weiss, "Circuitry in a Nanowire: Novel Growth Method May Transform Chips," Science News Online, vol. 161, No. 6; Feb. 9, 2002.

Press Release, "Nanowire-based electronics and optics comes one step closer," Eureka Alert, American Chemical Society; Feb. 1, 2002.

Weeks et al., "High-pressure nanolithography using low-energy electrons from a scanning tunneling microscope," Institute of Physics Publishing, Nanotechnology 13 (2002), pp. 38-42; Dec. 12, 2001.

CMP Cientifica, "Nanotech: the tiny revolution"; CMP Cientifica, Nov. 2001.

Diehl, et al., "Self-Assembled, Deterministic Carbon Nanotube Wiring Networks," Angew. Chem. Int. Ed. 2002, 41, No. 2.

G. Pirio, et al., "Fabrication and electrical characteristics of carbon nanotube field emission microcathodes with an integrated gate electrode," Institute of Physics Publishing, Nanotechnology 13 (2002), pp. 1-4, Oct. 2, 2001.

Leslie Smith, "An Introduction to Neural Networks," Center for Cognitive and Computational Neuroscience, Dept. of Computing & Mathematics, University of Stirling, Oct. 25, 1996; http//www.cs.stir.ac.uk/~lss/NNIntro/InvSlides.html.

V. Derycke et al., "Carbon Nanotube Inter- and Intramolecular Logic Gates," American Chemical Society, Nano Letters, XXXX, vol. 0, No. 0, A-D (2001).

Mark K. Anderson, "Mega Steps Toward the Nanochip," Wired News, Apr. 27, 2001.

Collins et al., "Engineering Carbon Nanotubes and Nanotube Circuits Using Electrical Breakdown," Science, vol. 292, pp. 706-709, Apr. 27, 2001.

Landman et al., "Metal-Semiconductor Nanocontacts: Silicon Nanowires," Physical Review Letters, vol. 85, No. 9, Aug. 28, 2000.

John G. Spooner, "Tiny tubes mean big chip advances," Cnet News.com, Tech News First, Apr. 26, 2001.

Jeong-Mi Moon et al., "High-Yield Purification Process of Singlewalled Carbon Nanotubes," J. Phys. Chem. B 2001, 105, pp. 5677-5681.

"A New Class of Nanostructure: Semiconducting Nanobelts Offer Potential for Nanosensors and Nanoelectronics," Mar. 12, 2001, http://www.sciencedaily.com/releases/2001/03/010309080953.htm.

Hermanson et al., "Dielectrophoretic Assembly of Electrically Functional Microwires from Nanoparticle Suspensions," Materials Science, vol. 294, No. 5544, Issue of Nov. 2, 2001, pp. 1082-1086.

Press Release, "Toshiba Demonstrates Operation of Single-Electron Transistor Circuit at Room Temperature," Toshiba, Jan. 10, 2001.

J. Appenzeller et al., "Optimized contact configuration for the study of transport phenomena in ropes of single-wall carbon nanotubes," Applied Physics Letters, vol. 78, No. 21, pp. 3313-3315, May 21, 2001.

David Rotman, "Molecular Memory, Replacing silicon with organic molecules could mean tiny supercomputers," Technology Review, May 2001, p. 46.

Westervelt et al., "Molecular Electronics," NSF Functional Nanostructures Grant 9871810, NSF Partnership in Nanotechnology Conference, Jan. 29-30, 2001; http://www.unix.oit.umass.edu/~nano/NewFiles/FN19_Harvard.pdf.

Niyogi et al., "Chromatographic Purification of Soluble Single-Walled Carbon Nanotubes (s-SWNTs)," J. Am. Chem. Soc 2001, 123, pp. 733-734.

Duan et al., "Indium phosphide nanowires as building blocks for nanoscale electronic and optoelectronic devices," Nature, vol. 409, Jan. 4, 2001, pp. 67-69.

Paulson, et al., "Tunable Resistance of a Carbon Nanotube-Graphite Interface," Science, vol. 290, Dec. 1, 2000, pp. 1742-1744.

Wei et al., "Reliability and current carrying capacity of carbon nanotubes," Applied Physics Letters, vol. 79, No. 8, Aug. 20, 2001, pp. 1172-1174.

Collins et al., "Nanotubes for Electronics," Scientific American, Dec. 2000, pp. 62-69.

Avouris et al., "Carbon nanotubes: nanomechanics, manipulation, and electronic devices," Applied Surface Science 141 (1999), pp. 201-209.

Smith et al., "Electric-field assisted assembly and alignment of metallic nanowires," Applied Physics Letters, vol. 77, No. 9, Aug. 28, 2000, pp. 1399-1401.

Hone et al., "Electrical and thermal transport properties of magnetically aligned single wall carbon nanotube films," Applied Physics Letters, vol. 77, No. 5, Jul. 31, 2000, pp. 666-668.

Smith et al., "Structural anisotropy of magnetically aligned single wall carbon nanotube films," Applied Physics Letters, vol. 77, No. 5, Jul. 31, 2000, pp. 663-665.

Andriotis et al., "Various bonding configurations of transition-metal atoms on carbon nanotubes: Their effect on contact resistance," Applied Physics Letters, vol. 76, No. 26, Jun. 26, 2000, pp. 3890-3892.

Chen et al., "Aligning single-wall carbon nanotubes with an alternating-current electric field," Applied Physics Letters, vol. 78, No. 23, Jun. 4, 2001, pp. 3714-3716.

Bezryadin et al., "Self-assembled chains of graphitized carbon nanoparticles," Applied Physics Letters, vol. 74, No. 18, May 3, 1999, pp. 2699-2701.

Bezryadin et al., "Evolution of avalanche conducting states in electrorheological liquids," Physical Review E, vol. 59, No. 6, Jun. 1999, pp. 6896-6901.

Liu et al., "Fullerene Pipes," Science, vol. 280, May 22, 1998, pp. 1253-1255.

Yamamoto et al., "Orientation and purification of carbon nanotubes using ac electrophoresis," J. Phys. D: Appl. Phys 31 (1998) L34-L36.

Bandow et al., "Purification of Single-Wall Carbon Nanotubes by Microfiltration," J. Phys. Chem. B 1997, 101, pp. 8839-8842.

Tohji et al., "Purifying single walled nanotubes," Nature, vol. 383, Oct. 24, 1996, p. 679.

Dejan Rakovic, "Hierarchical Neural Networks and Brainwaves: Towards a Theory of Consciousness," Brain & Consciousness: Proc. ECPD Workshop (ECPD, Belgrade, 1997), pp. 189-204.

Dave Anderson & George McNeill, "Artificial Neural Networks Technology," A DACS (Data & Analysis Center for Software) State-of-the-Art Report, Contract No. F30602-89-C-0082, ELIN: A011, Rome Laboratory RL/C3C, Griffiss Air Force Base, New York, Aug. 20, 1992.

Greg Mitchell, "Sub-50 nm Device Fabrication Strategies," Project No. 890-00, Cornell Nanofabrication Facility, Electronics—p. 90-91, National Nanofabrication Users Network.

John-William DeClaris, "An Introduction to Neural Networks," http://www.ee.umd.edu/medlab/neural/nn1.html.

"Neural Networks," StatSoft, Inc., http://www.statsoftinc.com/textbook/stevnet.html.

Stephen Jones, "Neural Networks and the Computation Brain or Maters relating to Artificial Intelligence," The Brain Project, http://www.culture.com.au/brain_proj/neur_net.htm.

David W. Clark, "An Introduction to Neural Networks"; http://members.home.net/neuralnet/introtonn/index.htm.

"A Basic Introduction to Neural Networks"; http://blizzard.gis.uiuc.edu/htmldocs/Neural/neural.html.

Meyer et al., "Computational neural networks: a general purpose tool for nanotechnology," Abstract, 5th Foresight Conference on Molecular Nanotechnology; http://www.foresight.org/Conferences/MNT05/Abstracts/Meyeabst.html.

Saito et al., "A 1M Synapse Self-Learning Digital Neural Network Chip," ISSCC, pp. 6.5-1 to 6.5-10, IEEE 1998.

Espejo, et al., "A 16×16 Cellular Neural Network Chip for Connected Component Detection," Jun. 30, 1999; http://www.imse.cnm.csic.es/Chipcat/espejo/chip-2.pdf.

Pati et al., "Neural Networks for Tactile Perception," Systems Research Center and Dept. of Electrical Engineering, University of Maryland and U.S Naval Research Laboratory. 1987; http://www.isr.umd.edu/TechReports/ISR/1987/TR_87-123/TR_87-123.phtml.

Osamu Fujita, "Statistical estimation of the number of hidden units for feedforward neural networks," Neural Networks 11 (1998), pp. 851-859.

Abraham Harte, "Liquid Crystals Allow Large-Scale Alignment of Carbon Nanotubes," CURJ (Caltech Undergraduate Research Journal), Nov. 2001, vol. 1, No. 2, pp. 44-49.

"Quantum-Dot Arrays for Computation," ORNL Review vol. 34, No. 2, 2001, pp. 1-5 http://www.ornlgov/ORNLReview/v34_2_01/arrays.htm.

"Elements of Artificial Neural Networks" K. Mehrotra, C. K. Mohan, S. Ranka, 1997, MIT Press, pp. 116-135.

"Self-assembled chains of graphitized carbon nanoparticles" A. Bezryadin, R.M. Westervelt, M. Tinkham, Dec. 21, 1998.

"Collective Transport in Arrays of Small Metallic Dots" A. Alan Middleton, N.S. Wingreen, 1993, The American Physical Society, 0031-9007/93/71(19)/3198(4), pp. 3198 through 3201.

"Solid-State thin-film memistor for electronic neural networks", S. Thakoor, A. Moopenn, T. Daud, and A.P. Thakoor, Journal of Applied Physics—Mar. 15, 1990—vol. 67, Issue 6, pp. 3132-3135.

"Computational nanotechnology with carbon nanotubes and fullernes", Srivastava, D. Menon M. Kyeongjae Cho, NASA Ames Res. Center, Moffett Field, CA, Computing in Science & Engineering, Jul./Aug. 2001, vol. 3, Issue 4, pp. 42-55.

X. Liu, et al., "Electric-Field-Induced Accumulation and Alignment of Carbon Nanotubes," 2002 Annual Report Conference on Electrical Insulation and Dielectric Phenomena; 2002 IEEE, pp. 31-34.

Kokosiński, Zbigniew, *An Associative Processor for Multicomparand Parallel Searching and Its Selected Applications*, University of Aizu, Department of Computer Science, Aizu-Wakamatsu, 965-80, Fukushima, Japan.

K. Asada, S. Komatsu & M. Ikeda, *Associative Memory with Minimum Hamming Distance Detector and Its Application to Bus Encoding*, VLSI Design and Education Center (VDEC), University of Tokyo, Tokyo 113-8685.

Jose C. Principie, Jose A.B. Fortes, *Next Generation Memory: Nano Content Addressable Memory (NanoCAM)*, University of Florida, Reference UF #11506.

A. Natarajan, D. Jasinski, W. Burleson, R. Tessier, *A Hybrid Adiabatic Content Addressable Memory for Ultra Low-Power Applications*, GLSVLSI '03, Apr. 28-29, Washington, D.C., U.S.A.

Chia, Kang-Ngee, et al., *High Performance Automatic Target Recognition Through Data-Specific VLSI*, IEEE Transactions on Very Large Scale Integration (VLSI) Systems, vol. 6, No. 3, Sep. 1998.

Badel, et al., *VLSI Realization of a Two-Dimensional Hamming Distance Comparator ANN for Image Processing Applications*, ESANN 2003 Proceedings—European Symposium on Artificial Neural Networks, Bruge (Belgium), Apr. 23-25, 2003.

S. Bridges, et al., *A Reconfigurable VLSI Learning Array*, University of Washington, Computer Science and Engineering, Seattle, WA.

John H. Shaffer, *Designing Very Large Content-Addressable Memories*, Written Preliminary Examination—Part II, Distributed Systems Laboratory, CIS Department, University of Pennsylvania, Dec. 5, 1992.

O. Melnik, et al., *A Gradient Descent Method for a Neural Fractal Memory*, Volen Center for Complex Systems, Brandeis University, Waltham, MA, USA, 1998.

David J. Stucki and Jordan B. Pollack, *Fractal (Reconstructive Analogue) Memory*, Laboratory for Artificial Intelligence Research, Department of Computer and Information Science, The Ohio State University, 14th Annual Conference of the Cognitive Science Society, Bloomington, Indiana, Jul. 1992.

Erhard Bieberich, *Recurrent fractal neural networks: a strategy for the exchange of local and global information processing in the brain*, Biosystems 66 (2002) 145-164.

* cited by examiner

FRACTAL MEMORY AND COMPUTATIONAL METHODS AND SYSTEMS BASED ON NANOTECHNOLOGY

CROSS-REFERENCE TO RELATED PATENT APPLICATIONS

This patent application is a continuation of U.S. patent application Ser. No. 11/269,416, "Fractal Memory and Computational Method and Systems Based on Nanotechnology," which was filed on Nov. 7, 2005 now U.S. Pat. No. 7,502,769, the disclosure of which is incorporated herein by reference in its entirety. U.S. patent application Ser. No. 11/269,416, was a continuation-in-part of U.S. patent application Ser. No. 11/147,081, entitled "Plasticity-Induced Self Organizing Nanotechnology for the Extraction of Independent Components from a Data Stream" filed on Jun. 6, 2005 now U.S. Pat. No. 7,409,375, the disclosure of which is incorporated herein by reference in its entirety. U.S. patent application Ser. No. 11/269,416 was also a continuation-in-part of U.S. patent application Ser. No. 11/045,538, entitled "Solution-Based Apparatus of an Artificial Neural Network Formed Utilizing Nanotechnology," filed on Jan. 31, 2005 now U.S. Pat. No. 7,039,619, the disclosure of which is incorporated herein by reference in its entirety.

TECHNICAL FIELD

Embodiments generally relate to molecular technology, such as, for example, nanotechnology. Embodiments are also related to content-addressable memories, methods and systems. Embodiments are also related to fractal memory devices, methods and systems. Embodiments are also related to distributed computing architectures, methods and systems. Embodiments also relate to object and pattern recognition devices, methods and systems. Embodiments are additionally related to neural networks and neural devices, such as, for example, artificial synapse integrated circuit (IC) components and chips.

BACKGROUND OF THE INVENTION

Object and pattern recognition involves the goal of recognizing patterns and objects from large quantities of data and also the ability to estimate the positions and orientations of recognized patterns and/or objects in three-dimensional space. The data to be analyzed can be, for example, two-dimensional gray-scale or color images or three-dimensional range data images, depending upon specific design goals. Applications for object recognition are many and include industrial machine vision, medical image analysis, and speech recognition.

One of the problems with current object and/or pattern recognition techniques is that such methodologies are limited primarily to software-based implementations. A number of software-based object recognition methods have been developed. Because software implementations are performed on conventional sequential computers, however, they are unable to take advantage of the inherent parallelism of recognition algorithms. That is, object and/or pattern recognition can be enhanced substantially if based on parallel processing configurations rather than sequential methods.

Hardware accelerators do exist for performing parallel pattern matching. Such systems have become known as a Content Addressable Memory (CAM). Content Addressable Memories (CAM's) perform simultaneous matching of many patterns by associating comparison circuitry with stored data and greatly improve the performance of a number of applications. Unfortunately, current CAM's do not completely solve pattern recognition problems and their results must be analyzed further by serial processing methods. We are left with a system that possess great potential but substantially lacks at performing the calculations required for massive pattern recognition tasks, particularly for the field of intelligent signal processing.

As recognition systems grow to encompass many classifications, the size of the computation increases dramatically. For example, consider the case of a pattern recognition system designed to recognize 10 patterns and another system design to recognize 100 patterns. Although the later recognition device will classify 10 times the number of patterns it will consume 10 times the resources. If the system is emulated in a serial device it will take 10 times as long. Yet, it is usually the case that the recognition of each pattern is not dependant on the recognition of any other pattern. If the recognition system is constructed in an entirely parallel arrangement, so that each pattern can be analyzed independently, then as the pattern recognition system grows larger the time for recognition remains the same. For these types of highly parallel recognition problems it would be advantageous to design a completely parallel architecture capable of infinite scalability while utilizing current fabrication technology.

Applications drive the need for computational power. Many of the current unsolved problems with commercial applicability require real-time signal processing of massive data streams. Image and speech recognition are two important examples. Object recognition is intrinsically solved in most moderately complex biological nervous systems in 100 synaptic steps or less. Almost without exception, current technology fails at performing tasks most animals and insects find effortless. Actions such as walking, flying or driving require prodigious amounts of computation and analysis on vast quantities of high-dimensional noisy data. With current technology it is relatively easy to obtain massive data streams. It is not easy, however, to effectively act on this data. The ability to distinguish objects in large quantities of high-dimensional streaming information is absolutely critical, and currently represents a serious computational bottleneck. A robust and scalable solution to this problem would make possible vastly more intelligent computer systems.

It is believed that a possible solution to the aforementioned problems may involve the use of nanotechnology-based devices and implementations. One example of a hardware device implemented with nanotechnology-based components is the physical neural network disclosed in U.S. Pat. No. 6,889,216, entitled "Physical Neural Network Design Incorporating Nanotechnology," which issued to Alex Nugent on May 3, 2005. U.S. Pat. No. 6,889,216 is incorporated herein by reference in its entirety. Such a physical neural network, which can be referred to as a Knowm™ network generally includes one or more neuron-like nodes, which are formed from a plurality of interconnected nanoconnections formed from nanoconductors. Such connections constitute Knowm™ connections. Each neuron-like node sums one or more input signals and generates one or more output signals based on a threshold associated with the input signal.

The Knowm™ device physical neural network also includes a connection network formed from the interconnected nanoconnections, such that the interconnected nanoconnections used thereof by one or more of the neuron-like nodes are strengthened or weakened according to an application of an electric field, variations in frequency, and so forth. U.S. Pat. No. 6,889,216 is incorporated herein by reference.

Another example of a Knowm™ network or system is described in U.S. Patent Publication No. 20030236760, entitled "Multi-layer Training in a Physical Neural Network Formed Utilizing Nanotechnology," by inventor Alex Nugent, which was published on Dec. 25, 2003. U.S. Patent Publication No. 20030236760 generally describes methods and systems for training at least one connection network located between neuron layers within a multi-layer physical neural network (e.g., a Knowm™ network or device). The multi-layer physical neural network described in U.S. Patent Publication No. 20030236760 can be formed with nanotechnology-based components in the context of a plurality of inputs and a plurality outputs. Such a multi-layer physical neural network is composed of a plurality of layers, wherein each layer includes one or more connection networks and one or more associated neurons, which are configured with nanotechnology-based components.

Thereafter, a training wave, as further described in U.S. Patent Publication No. 20030236760, can be initiated across one or more connection networks associated with an initial layer of the multi-layer physical neural network which propagates thereafter through succeeding connection networks of succeeding layers of the multi-layer physical neural network by successively closing and opening at least one switch associated with each layer of the multi-layer physical neural network. At least one feedback signal thereof can be automatically provided to each preceding connection network associated with each preceding layer thereof to strengthen or weaken nanoconnections associated with each connection network of the multi-layer physical neural network. U.S. Patent Publication No. 20030236760 is incorporated herein by reference.

A further example of a Knowm™ network or system is described in U.S. Patent Publication No. 20040039717, entitled High-density synapse chip using nanoparticles" by inventor Alex Nugent. U.S. Patent Publication No. 20040039717 published on Feb. 26, 2004 and generally describes a physical neural network synapse chip (i.e., a Knowm™ chip) and a method for forming such a synapse chip. The synapse or Knowm™ chip can be configured to include an input layer comprising a plurality of input electrodes and an output layer comprising a plurality of output electrodes, such that the output electrodes are located perpendicular to the input electrodes. A gap is generally formed between the input layer and the output layer.

A solution can then be provided which is prepared from a plurality of nanoconductors and a dielectric solvent. The solution is located within the gap, such that an electric field is applied across the gap from the input layer to the output layer to form nanoconnections of a physical neural network implemented by the synapse chip. Such a gap can thus be configured as an electrode gap. The input electrodes can be configured as an array of input electrodes, while the output electrodes can be configured as an array of output electrodes. U.S. Patent Publication No. 20040039717 is also incorporated herein by reference.

A further example of a Knowm™ network or system is disclosed in U.S. Patent Publication No. 20040153426, entitled "Physical Neural Network Liquid State Machine Utilizing Nanotechnology," by inventor Alex Nugent, which was published on Aug. 5, 2004. U.S. Patent Publication No. 20040153426 generally discloses a physical neural network (i.e., a Knowm™ network), which functions as a liquid state machine.

The physical neural network described in U.S. Patent Publication No. 20040153426 can be configured from molecular connections located within a dielectric solvent between pre-synaptic and post-synaptic electrodes thereof, such that the molecular connections are strengthened or weakened according to an application of an electric field or a frequency thereof to provide physical neural network connections thereof. A supervised learning mechanism is associated with the liquid state machine, whereby connections strengths of the molecular connections are determined by pre-synaptic and post-synaptic activity respectively associated with the pre-synaptic and post-synaptic electrodes, wherein the liquid state machine comprises a dynamic fading memory mechanism. U.S. Patent Publication No. 20040153426 is also incorporated herein by reference.

A further example of a Knowm™ network or system is disclosed in U.S. Patent Publication No. 20040162796, entitled "Application of Hebbian and anti-Hebbian Learning to Nanotechnology-based Physical Neural Networks" by inventor Alex Nugent, which published on Aug. 19, 2004. U.S. Patent Publication No. 20040162796 generally discloses a physical neural network (i.e., Knowm™ network) configured utilizing nanotechnology. The Knowm™ network disclosed in U.S. Patent Publication No. 20040162796 includes a plurality of molecular conductors (e.g., nanoconductors) which form neural connections between pre-synaptic and post-synaptic components of the physical neural network.

Based on the foregoing, it is believed that a need exists to perform massively parallel object recognition. In particular, a need exists for performing a probabilistic best match of a pattern from an unlimited size database in a fixed time interval. It is a believed that a solution to this need involves the use of nanotechnology components and systems as disclosed in greater detail herein.

BRIEF SUMMARY

The following summary is provided to facilitate an understanding of some of the innovative features unique to the embodiments presented herein, and is not intended to be a full description. A full appreciation of the various aspects disclosed herein can be gained by taking the entire specification, claims, drawings, and abstract as a whole.

It is, therefore, one aspect of the embodiments to provide for an object circuit based on nanotechnology.

It is another aspect of the embodiments to provide for fractal memory devices, systems and methods based on nanotechnology.

The above and other aspects can be achieved as will now be described. Fractal memory systems and methods are disclosed. In general, a fractal tree can be provided that includes one or more fractal branches emanating from a common fractal trunk. One or more object circuits are associated with the fractal tree. The object circuit(s) is configured from a plurality of nanotechnology-based and microelectronic-based components to provide a variety of computational functions, for example pattern recognition, logical operations or programs run on a microprocessor. Additionally one or more fractal addresses of an object circuit is provided at a fractal trunk by the selective activation of trunk electrodes and signals are routed to the respective address by router circuits.

Data can be transmitted to a fractal address of an object circuit by specifying the fractal address at the fractal trunk. Data can also be sent from an object circuit to another object circuit associated with the fractal tree by mapping the output of the fractal trunk and utilizing a portion of it as the address of another object circuit. The object circuit can be provided in the form of pattern recognition circuitry, programmable logic circuits and/or may be implemented as a microprocessor.

The object circuit can be configured as a pattern recognition circuit from a plurality of neural nodes configured as an ensemble of ensembles. Such neural nodes can be configured from nanotechnology-based components. The object circuit can also be configured based on a circuit layout in which a distance from each object circuit to an output point is the same. Additionally, temporal data can be utilized to encode recognition accuracy for object circuits configured as pattern recognition circuitry. The fractal architecture can be configured as a fractal memory chip, wherein a plurality of content-addressable memories can be stacked in association with a plurality of router chips to provide an enhanced fractal tree structure. Additionally, one or more recognition trigger electrodes can be utilized to route signals in the fractal architecture.

BRIEF DESCRIPTION OF THE DRAWINGS

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

DETAILED DESCRIPTION OF THE INVENTION

The particular values and configurations discussed in these non-limiting examples can be varied and are cited merely to illustrate an embodiment of the present invention and are not intended to limit the scope of the invention.

Figure 1:
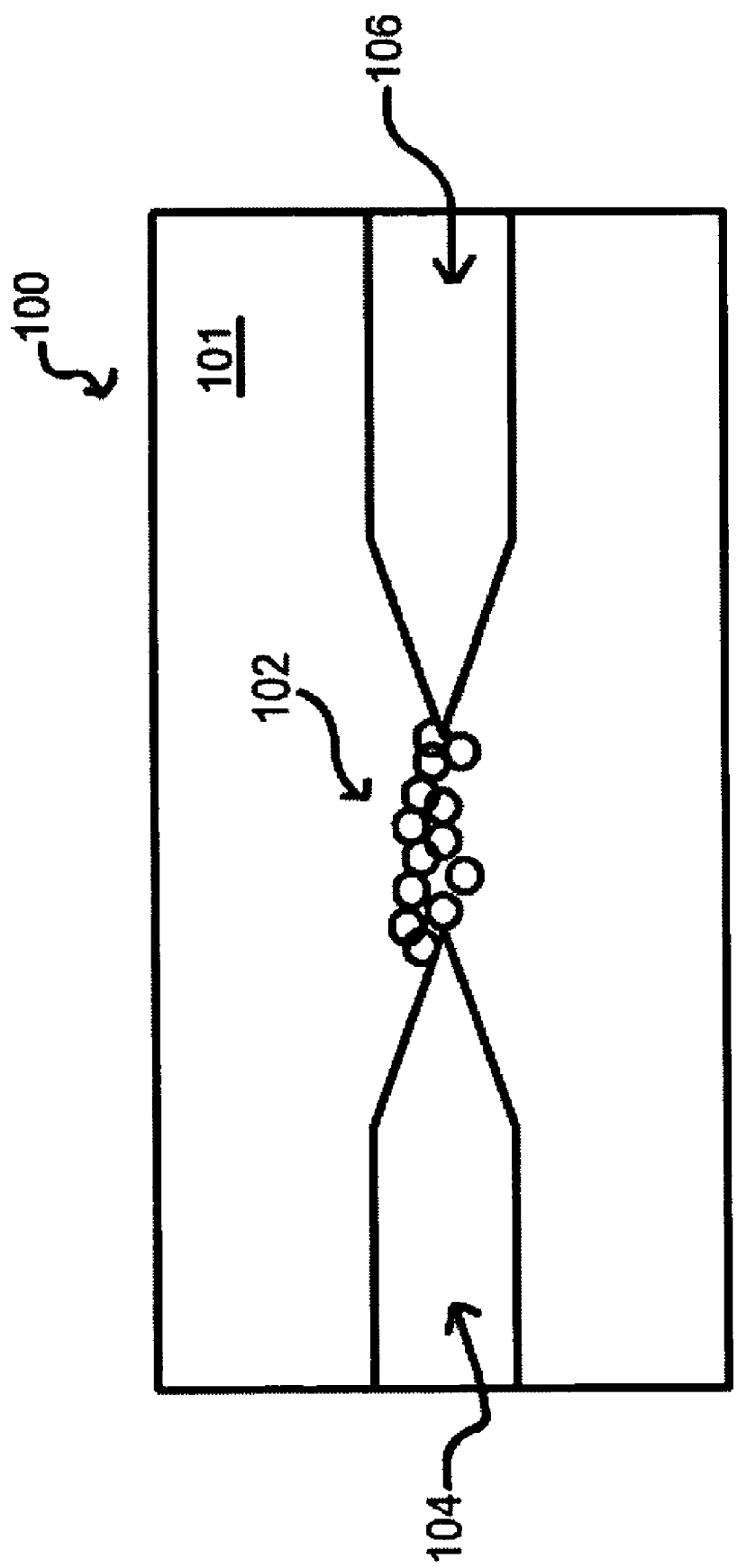
FIG. 1 illustrates a graphical representation of a physical neural network connection device that can be adapted for use in accordance with one or more embodiments.

FIG. 1 illustrates a graphical representation of a self-assembling system 100 that can be adapted for use in accordance with one or more embodiments. System 100 can be utilized to implement an apparatus or system referred to as a Knowm™ network or device. System 100 can be implemented as a physical neural network device that can, among many applications, extract information from a data-stream. The information processed can drive a plasticity rule that utilizes high-gradient-density electric fields to attract, and random thermal motion to repel, particles suspended in a liquid-interface in the context of a traditional integrated electronic chip.

Statistical regularities from the data stream can be coupled to the alignment of molecular connections between pre- and post-synaptic electrodes, which modify their electrical resistance and in turn drive modular integrated circuits. System 100 therefore is composed of a plurality of particles 102 disposed within a solution 101 between electrodes 104 and 106. Electrode 104 can comprise, for example, an input electrode, and electrode 106 can comprise, for example, an output electrode.

The particles 102 form connections (e.g., nanoconnections) between electrodes 104 and 106. The connections 102 are located generally between the input electrode 104 and the output electrode 306. A network of connections can be implemented between a cross-bar arrangement of input and output electrodes. Examples of particles 102 include components such as, for example, nanoparticles including but not limited to nanowires, nanotubes, nanoribbons, nanofibers and so forth.

A nanotube, for example, can be configured as a fullerene molecule having a cylindrical or toroidal shape. Note that fullerenes are one of only four types of naturally occurring forms of carbon (the other three being diamond, graphite and ceraphite. Such components are typically configured as molecules composed entirely of carbon, taking the form of a hollow sphere, ellipsoid, or tube. Spherical fullerenes are sometimes called buckyballs, while cylindrical fullerenes are called buckytubes or nanotubes. A nanowire, on the other hand, can be implemented as a wire of dimensions on the order of a nanometer or smaller. Such a nanowire can also be referred to as a "quantum wire" due to the fact that at these scales quantum mechanical effects are important. The use of carbon or other such materials merely represents illustrative examples. It can be appreciated that a variety of other types of materials may also be utilized to implement such particles or nanoparticles, depending upon design considerations.

Other potential particles that can be adapted for use in accordance with the embodiments disclosed herein include for example, but are not limited to, other molecular particles such as, for example, DNA. It should be appreciated by those skilled in the art that such particles can be provided in a variety of shapes and sizes and material without departing from the teachings herein. System 100 therefore can constitute a connection network that is disposed not merely of one connection between two electrodes, but a plurality of connections between a plurality of input electrode and output electrodes.

System 100 can be utilized to implement a physical neural network (i.e., a Knowm™ enabled physical neural network) that is composed of two basic components. First, such a physical neural network or system 100 can possess one or more neuron-like nodes that sum a signal and output a signal based on the amount of input signal received. Such a neuron-like node is generally non-linear in output. In other words, there should be a certain threshold for input signals, below which nothing can be output or a low value is output and above which a high output is generated. This is considered the basic building block neural networks, and can be accomplished by an activation function. The second requirement of the system or physical neural network 100 is the inclusion of a connection network composed of a plurality of interconnected electrodes (i.e., nanoconnections).

System 100 thus can constitute a physical neural network composed of many molecular or nanoparticles 102 that form a bridge across respective pre- and post-synaptic electrodes 104, 106. An individual particle in the liquid or solution 101 is not stable. The statistical properties of a group of particles, however, under the influence of a plasticity rule and random thermal motion, are stable. It is this stability that permits the use of plasticity rules to train the resulting synapse and/or physical neural network 100.

Figure 2:
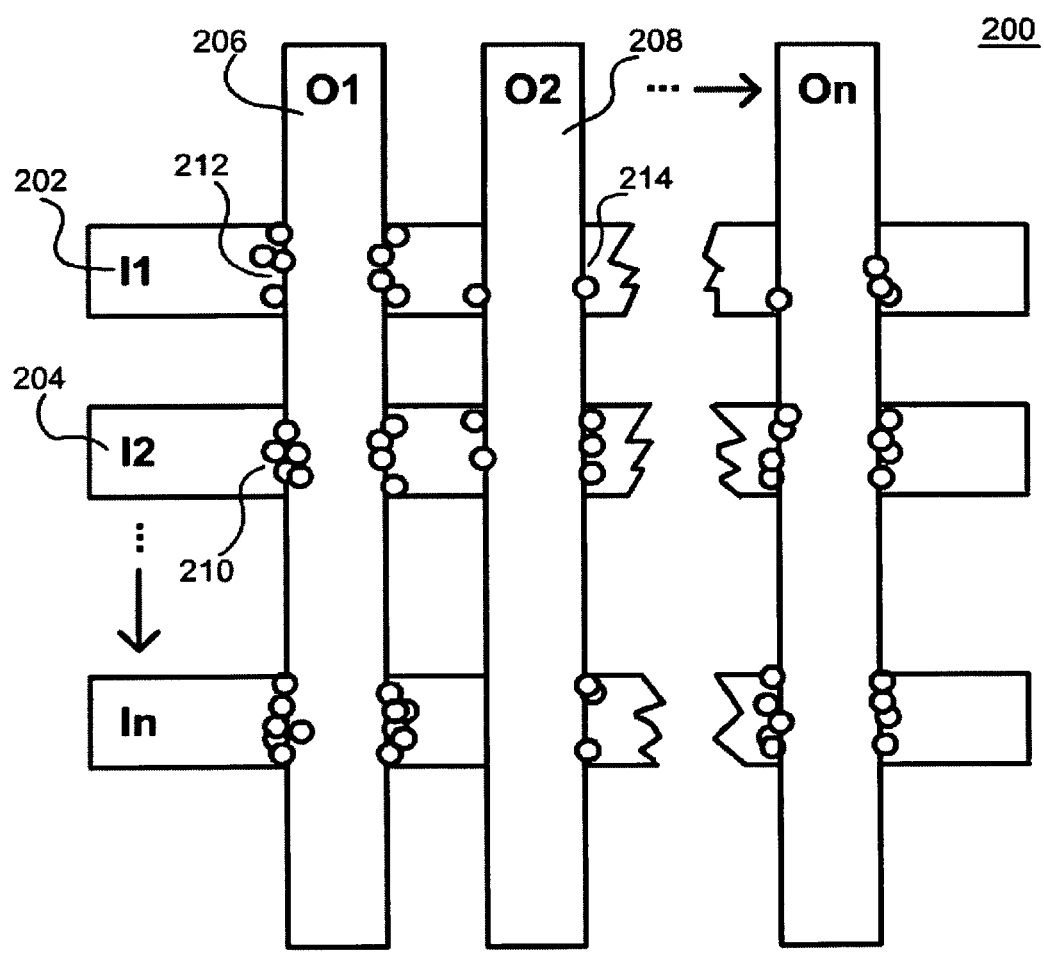
FIG. 2 illustrates a connection matrix view of connections that can be implemented in accordance with one or more embodiments.

FIG. 2 illustrates a view of a neural network device 200 that can be implemented in accordance with one or more embodiments. Note that the neural network device 200 can function as synapse matrix composed of a plurality of input or pre-synaptic electrodes 202, 204 and a plurality of output or post-synaptic electrodes 206, 208. It can be appreciated that although only electrodes 206, 209 and 202, 204 are illustrated in FIG. 2, many other electrodes may be implemented in accordance with other embodiments and depending upon design considerations. A plurality of particles (e.g., nanoparticles) are disposed between or bridging electrodes 206 and 204. Similarly, a plurality of particles 212 (e.g., nanoparticles) can be disposed between electrodes 206 and 202. Likewise, a plurality of molecular particles 214 (e.g., nanoparticles) can be disposed between electrodes 208 and 218. The neural network device 200 can function as a synapse chip formed in the context of a cross-bar array, named from the fact that electrodes 206, 208 are set in a cross-bar pattern with respect to electrodes 202, 204.

An example of a synapse chip architecture that may be adapted for use in accordance with one or more embodiments is disclosed in U.S. Patent Publication No. US2004/0039717A1, entitled "High-Density Synapse Chip Using Nanoparticles" by Alex Nugent, which published on Feb. 26, 2004 based on a patent application filed Aug. 22, 2002. U.S. Patent Publication No. US2004/0039717A1 is incorporated herein by reference in its entirety. The configuration depicted in U.S. Patent Publication No. US2004/0039717A1 can be implemented in the context of a cross-bar array pattern.

As indicated previously, there exists a need to perform massively parallel object recognition. The embodiments disclosed herein therefore are directed toward devices and methodologies for performing statistical pattern recognition of an unlimited size pattern database in a fixed time interval using microelectronic circuits and a nanotechnological implementation of a synapse. Note that as utilized herein the term "object recognition" can be utilized interchangeably with the term "pattern recognition" or "sequence recognition" to refer to essentially the same type of recognition objectives. In all cases it is desired to match a pattern of binary data to statistical templates and provide a means to record the address of the circuit that provided the best match.

The basic idea behind a fractal implementation of a pattern recognition system or method involves construction of a tree-like architecture with many branches. At the very tips of such branches are located object circuits configured for pattern recognition. Each pattern recognition circuit independently analyzes a particular data sequence that is projected to all pattern recognition circuits. The more accurate the match between the projected pattern and the pattern stored at the pattern recognition circuit, the faster the circuit will activate an output electrode to a high voltage.

When an output electrode activates, it sends a signal down the fractal tree. At the convergence of every branch, a router circuit routes the signal from the branch that activated first, sending this information as one addition bit on an increasing number of electrodes. The first signal to get to the base of the tree is the best match and this information is encoded by the fractal address of the object circuit that made the first match. The time interval from the broadcast of the pattern to the occurrence of an address at the fractal trunk relates a measure of the certainty of the pattern match.

Figure 3:
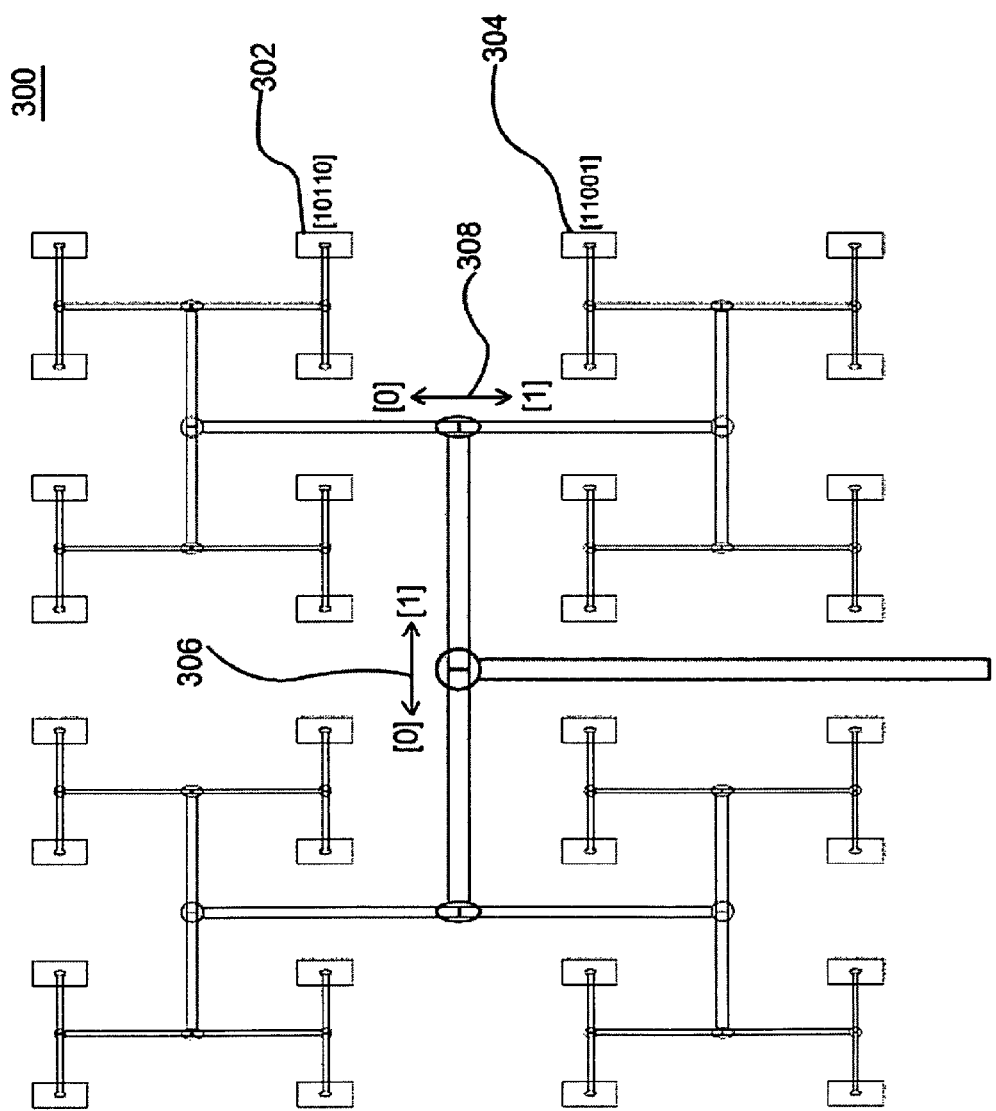
FIG. 3 illustrates a schematic diagram of a fractal tree architecture that can be implemented in accordance with a preferred embodiment.

Consider for instance the fractal tree architecture depicted in FIG. 3. In general, FIG. 3 illustrates a schematic diagram of a fractal tree 300 that can be implemented in accordance with a preferred embodiment. The example depicted in FIG. 3 indicates that each object circuit in the tree 300 has a unique binary address. To attain an address, it is necessary to follow the path from the "trunk" to the "tip", taking note of the direction of each turn. Although arbitrary, a "1" can be marked for a right turn and a "0" for a left turn as indicated by arrow sets 306 and 308. In this way, each object circuit possesses a unique address with a size determined by the number of branches. For example, object circuit 302 depicted in FIG. 3 is associated with an address 10110 while an object circuit 304 is associated with an address 11001.

The object circuit addresses represent every possible combination of 1's and 0's for an "N" dimensional binary pattern, where N is the number of branching levels in the fractal tree 300. Two specific sample object circuits 302 and 304 are generally indicated in the fractal tree 300 depicted in FIG. 3, along with a number of other nodes, which are not marked by reference numerals, but illustrated nevertheless for general illustrative purposes. It can be appreciated that the specific fractal tree 300 illustrated in FIG. 3 represents only one of many different types of fractal tree configurations that can be implemented in accordance with varying embodiments. The fractal tree architecture 300 can be realized by simple electronic circuits 400 as indicated in FIG. 4, wherein the "branches" of fractal tree 300 can be implemented as a collection of electrodes.

Figure 4:
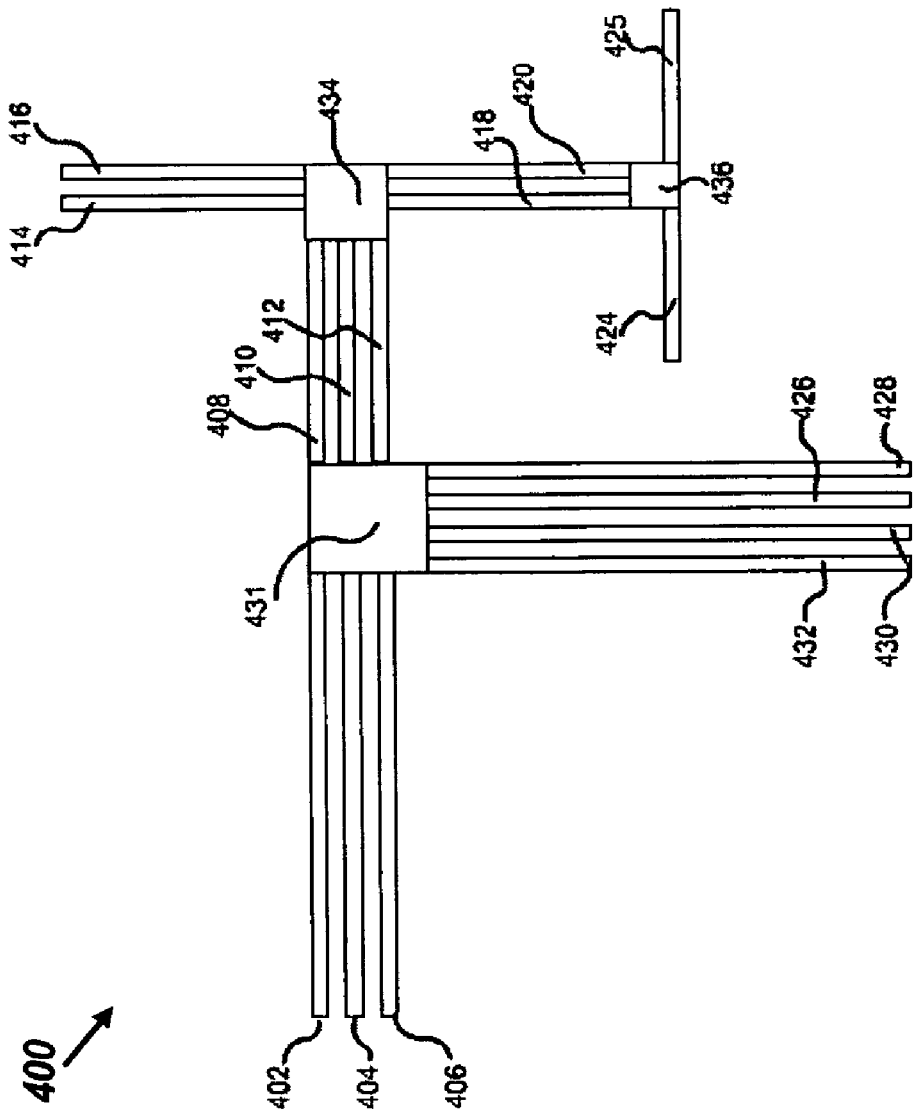
FIG. 4 illustrates a schematic diagram of router circuitry in accordance with an embodiment.

FIG. 4 illustrates a schematic diagram of circuit 400, which includes a plurality of router circuits 431, 434 and 436. Router circuit 431 is connected to electrodes 402, 404, 406 and electrodes 408, 410, 412. Router circuit 431 is also connected to electrodes 426, 428, 430, 432. Router circuit 434 is connected to electrodes 414, 416 and electrodes 408, 410, 412. Router circuit 434 is also connected to electrodes 418, 420. Router circuit 436 is connected to electrodes 424 and 425 and also electrodes 418, 420.

The router circuitry of router circuits 431, 434, and 436 can take a variety of forms, but the basic functionality is fairly simple. To understand the routing circuitry of router circuits 431, 434, and 436 it is important to understand the desired behavior within a pattern recognition device. First, when a recognition event occurs at an object circuit configured as a pattern recognition circuit, such as object circuits 502 and 504 of FIG. 5, electrodes 424 and 425 are activated. It should be noted that object circuit 502 and object circuit 504 of FIG. 5 may be configured to detect a pattern and its anti-pattern. For example, whereas object circuit 502 may be tuned to detect the binary pattern [001010], object circuit 504 may be tuned to detect the anti-pattern [110101]. The electrode that is activated first is determined by the degree that the object circuit provides the best match as given by a probabilistic weighting of input lines. The location of the object circuit can be anywhere on the implemented integrated circuit chip, and confined to a grid defined by the fractal structure of the device.

Figure 5:
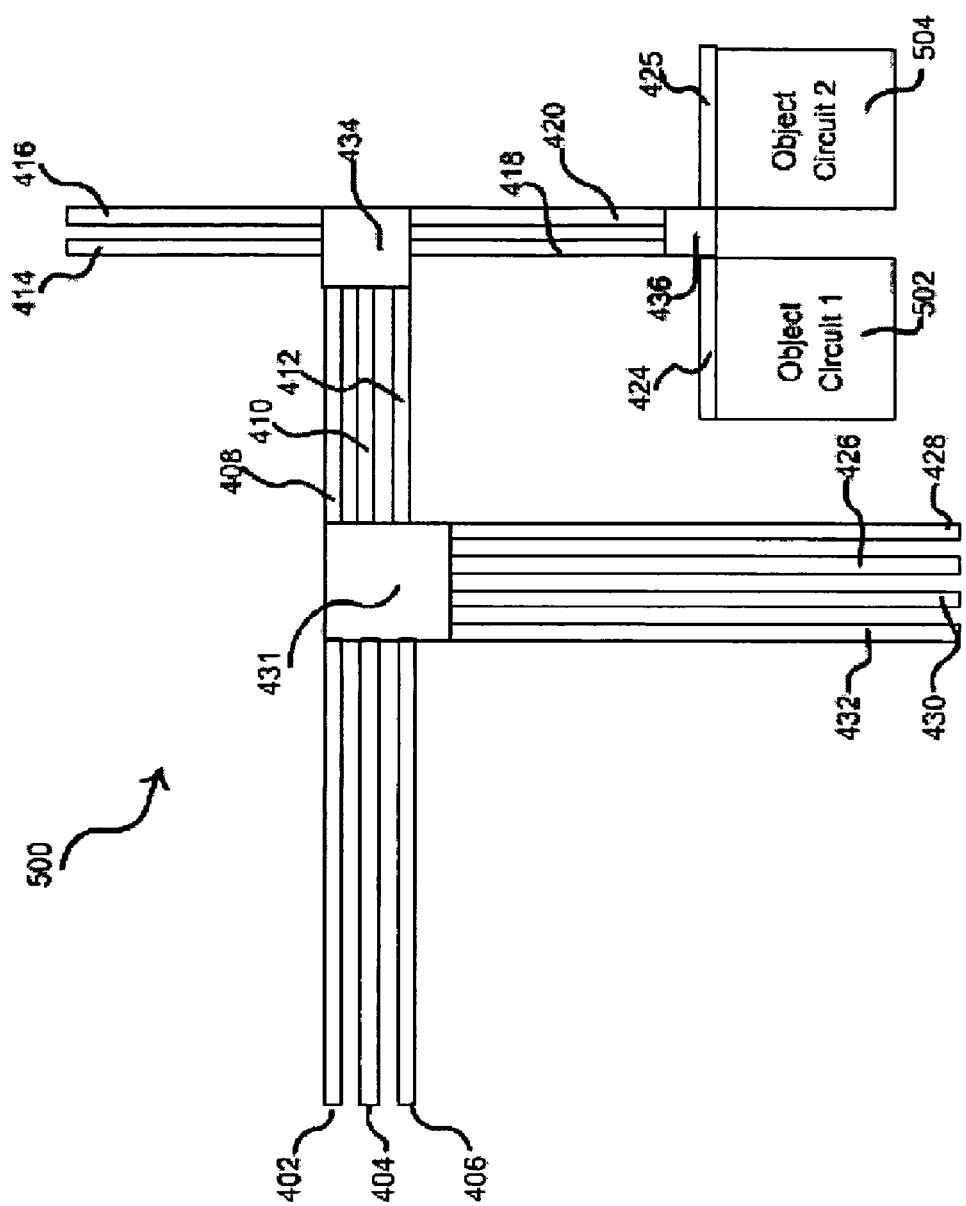
FIG. 5 illustrates a schematic diagram of an object circuit that can be implemented in accordance with another embodiment.

FIG. 5 illustrates a schematic diagram of a pattern recognition circuit 500 that can be implemented in accordance with another embodiment. Note that in FIGS. 4-5, identical or similar parts or components are generally indicated by identical reference numerals. Thus, circuit 500 is similar to circuit 400; the difference being that circuit 500 incorporates two object circuits 502 and 504, which are respectively connected to electrodes 424 and 425.

For illustrative purposes, assume that each object circuit 502 and 504 depicted in FIG. 5 received the same binary input. Additionally assume that object circuit 504 contains memory elements that encode a probabilistic weighting of input lines that more closely matched the input pattern. As a result of the closer match, a higher voltage is attained at electrode 425 in a shorter amount of time. The details of this pattern recognition circuitry will be detailed shortly. The router circuitry 436 compares the voltage on electrodes 424 and 425 associated with object circuit 502 and 504, respectively. In this example, the electrode associated with object circuit 504 is of a higher voltage in a shorter amount of time, so the router circuitry 436 passes a signal from the object circuit 504 through the router and on to the next router circuit 434 connecting electrodes 414, 416, 418, and 420.

Note that two electrodes pairs 414, 416 and 418, 420 are input to router circuit 434 and three electrodes 408, 410, 412 are output from router circuit 434. In addition to passing the information of object circuit detection direction, one electrode is considered the "recognition trigger". The routing direction is determined by which recognition trigger is activated first.

It is important at this point to review the general operation before discussing the specific router circuitry. Recall that the purpose of such a circuit is to broadcast the fractal address of the object circuit to make the first recognition down the fractal tree (e.g., fractal tree 300) and to the "trunk". When the user presents a pattern to the object recognition device, it is thus analyzed by every object circuit of the chip simultaneously and the fractal address of the best-match object circuit appears at the fractal truck. The address indicates not only the object circuit to make the best match, but the fractal quadrant (s) as well. It can be seen that by assigning object circuits of various object classes to various fractal quadrants, any possible classification of input space is possible.

The first object circuit to identify the pattern activates and consequently sets up a series of electrical comparisons at every branch router circuit. For every comparison, the direction of the winning branch is added to the increasing number of electrodes via a voltage indicating the direction of the route. If the "winning" electrode came "from the right", then the voltage on the electrode will indicate a logical "1". If the winning electrode came "from the left" then the voltage on the electrode will indicate a logical "0". The assignment of a logical 1 to a right direction and a logical 0 to a left direction is of course arbitrary. Via a series of comparisons at each branch router circuit, the voltage at the fractal tree trunk will eventually indicate the address of the object-recognition circuit that performed the closest match. The opposite of this process is also possible. That is, if one provides an address via a pattern of binary voltages at the fractal tree trunk, a signal will be propagate to the specified object-recognition circuit. In such a way the fractal tree structure can be used for both receiving and transmitting information to and from object circuits.

Figure 6:
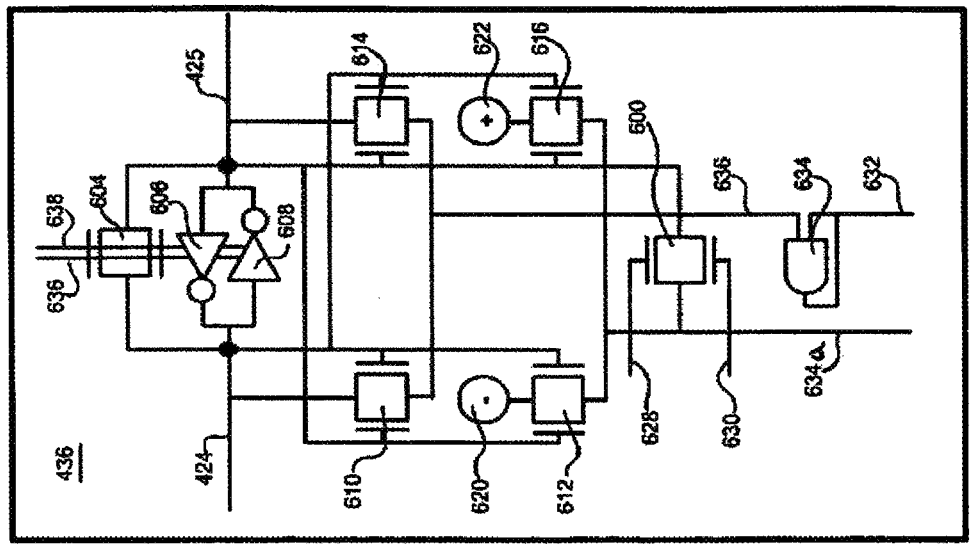
FIG. 6 illustrates a schematic diagram of a router circuit in accordance with a preferred embodiment.
Figure 6:
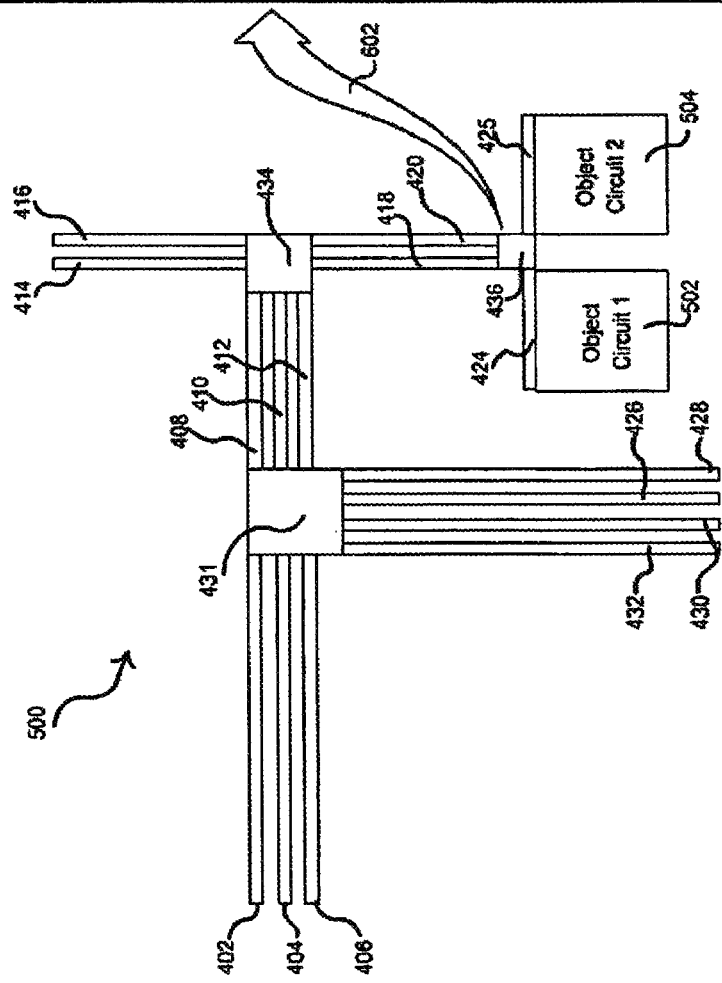

FIG. 6 illustrates a schematic diagram of the specific router circuitry for implementing one or more router circuits in accordance with a preferred embodiment. FIG. 6 thus generally illustrates the router circuitry associate with the last fractal branch level. Note that in FIGS. 5-6, identical or similar parts or elements are generally indicated by identical reference numerals. Circuit 500 is illustrated in both FIGS. 5-6 for clarity. Arrow 602 indicates a specific view of router circuit 436. Note that the other router circuits 431 and 434 are similar to circuitry of router circuit 436. As indicated by arrow 602, router circuit 436 can be implemented as an end-branch router circuit that is connected to the object recognition electrodes 424 and 425.

Router circuit 436 generally includes tri-state inverters 606 and 608 in FIG. 6. The tri-state inverter 606 is also connected to a pass gate 604. The output from tri-state inverter 606 can be connected to a pass gate 610. The input to tri-state inverter 608 can also be connected to pass gate 610. Similarly, the input to tri-state inverter 606 can be connected to a pass gate 614 along with the output from pass gate 608. Two other pass gates 612 and 614 can also be provided as a part of router circuit 436. Additionally, a pass gate can also be provided as a part of router circuit 426. Router circuit 436 additionally includes teach inputs 628 and 630 and a recognition trigger electrode 632. Additionally, router circuit 436 is connected to an address bit electrode 634a upon which address data can be provided.

Possible voltage states are also depicted in the configuration for router circuit 436 depicted in FIG. 6. For example, a "−1" voltage value is depicted as voltage source 620 supplied to pass gate 612 and a "+1" voltage value is depicted as voltage source 622 supplied to pass gate 616. Thus, a +1 voltage value represents a "high" voltage" while a "−1" voltage value represents a "low" voltage.

The router circuit 436 can receive as inputs a voltage at electrodes 424 and 425. When inputs 636 and 638 are set to complimentary voltages, the tri-state inverters 606 and 608 activate and pass gate 604 turns off (i.e. non-conducting). In the particular example detailed previously, object circuit electrode 2 (electrode 425) is of a higher voltage, which forces electrode 424 to a low voltage and electrode 425 to a high voltage. The complimentary object circuit electrode voltages turn on pass gates 614 and 616 and turns off pass gates 610 and 612. This in turn passes a logical "1", or high voltage, to electrode 634, or address bit 1. The second output, the "recognition trigger", is passed by pass gate 614 to electrode 636.

Electrode 636 and 632 can be provided as input to NAND gate 634. In addition, the output of NAND gate 634 is connected to electrode 632. The function of NAND gate 636 is important and the same function can be attained with a number of alternative circuits. The NAND gate can be used for example, for the case where electrode 632 has already been driven low by a lower-level router circuit. This can happen if, for instance, an object circuit on another branch of the fractal tree is activated before an object circuit on the branch indicated by FIG. 6. In this case it is important that the recognition trigger, as indicated by electrode 632, remains in a low voltage state. In addition it is preferred that the attractor landscape of the NAND gate (634) or an equivalent circuit be such that when electrode 636 is raised to a positive voltage while electrode 632 is held at a zero or near-zero voltage, the voltages will reach a stable state when electrode 632 is high and electrode 636 is high.

In addition it is preferred that the attractor landscape of the NAND gate (634) or an equivalent circuit be such that when electrode 632 is lowered to a negative voltage while electrode 636 is held constant at a zero or near-zero voltage, the voltages will reach a stable state when electrode 632 is low and electrode 636 is high. Additionally, it is advantageous that the attractor landscape of the NAND gate (634) or an equivalent circuit be such that when electrodes 636 and 632 are equal or nearly equal to zero voltage, where zero voltage is defined as half the supply voltage, the NAND gate is in an unstable equilibrium and the time for the circuit to decay to a stable attractor point outside the influence of external voltage sources is longer than the clock period. The various attractor properties of the circuit can be attained by selective modification of transistor sizes comprising the NAND gate. The NAND gate 634 prevents static power dissipation in the event of one object circuit activating before another object circuit on another branch of the fractal tree while still allowing a recognition signal to pass if another has not already.

The entire device is in its resting state when the voltage on all recognition trigger electrodes is equal to approximately half the supply voltage, which is defined as "zero volts". During the process of recognition, for every recognition electrode that is positively activated there will be a complimentary electrode that is negatively activated. For example electrodes 424 and 425 in FIG. 6. During the reset clock cycle, which will be discussed shortly, pass gates open, for example pass gate 604 in FIG. 6, and the feedback circuits deactivate, for example tri-state inverters 606 and 608 in FIG. 6. Since the structure is highly symmetric, charge sharing between complimentary electrodes can ensure that the voltage is reset to zero.

As depicted in FIG. 6, when the teach inputs 628 and 630 are set to complimentary voltages, the voltage on electrode 634*a* can force the router circuit 436 to route in the direction indicated by the logical state of the address bit. In this manner, the object circuit indicated by the logical value of electrode 634 is forced into a positive state. It should also be noted that the complimentary object circuit electrode may be forced to a negative state. In other words, if electrode 425 is in a positive state then electrode 424 will be in a negative state and visa versa. If the teaching is off, the object circuit that matches an applied pattern, as indicated by a positive voltage, will route its address to the trunk via a series of voltage comparisons of the recognition trigger at the router junctions. The two-way nature of this router is important for initializing the states of the neural nodes in the object circuits, as will be discussed shortly.

To continue with the above mentioned example, if the object circuit 502 is activated before object circuit 504, the address bit available at address bit electrode 634*a* may output a logical "1" or high voltage and the recognition trigger output available at the recognition trigger electrode 632 would be high. Thus, by looking at the address bit, it can be determined which recognition circuit activated first and therefore provided the best pattern match. It is important to note that the object circuit can generally provide a match for a pattern that is much larger than a fractal dimension (i.e. the number of trunk electrode or branch levels). In this manner, a large dimensional pattern can be mapped efficiently to compact low-dimensional pattern. Because every object circuit receives the same input pattern and processes independently, the recognition speed is independent of the number of object circuits available. In other words, by combining chips in the fractal pattern depicted in FIG. 3 and adding a router circuit to each new junction, the number of searchable patterns may grow exponentially while providing the same recognition time. As will be discuss shortly, two or more fractal memory chips may be combined to form a larger fractal memory tree. In this way the circuit may be scaled indefinitely.

To put this device function into perspective, such a circuit can allow for the recognition of the best-match for a particular pattern, as given by a probabilistic weighting of each input line by the neural states of the neural nodes in the pattern recognition circuit. In other words, this structure is similar to a content-addressable memory in the respect that it will output the address of an object circuit that matches an applied pattern. The circuit is vastly more powerful for object-recognition (pattern recognition) tasks because 1) The device can be scaled indefinitely, 2) The address provided is the probabilistic best-match and not simply a direct match or hash-match, 3) The device holds significantly more content-addressable memory than any current device, 4) The fractal structure of the device allows for the most compact dimensionality reduction possible, 5) The fractal branching structure allows for arbitrary and indefinitely scalable partitions of the input space which results in universal pattern classification occurring on the chip rather than in software, 6) probabilistic pattern weighting may be learned on-chip and during device operation, 7) the time between pattern presentation and recognition provides a measure of the certainty of pattern match, and 8) the device will always return a result, which is useful in situations where "no answer" is not acceptable, such as robotic navigation.

The only difference in recognition time for a larger fractal tree is the time for the electrical signal to propagate through the fractal branches. One can appreciate that this technology can profoundly impact information processing, particularly in the fields of machine vision, voice recognition, robotics and intelligent Internet searching to name a few.

Figure 7:
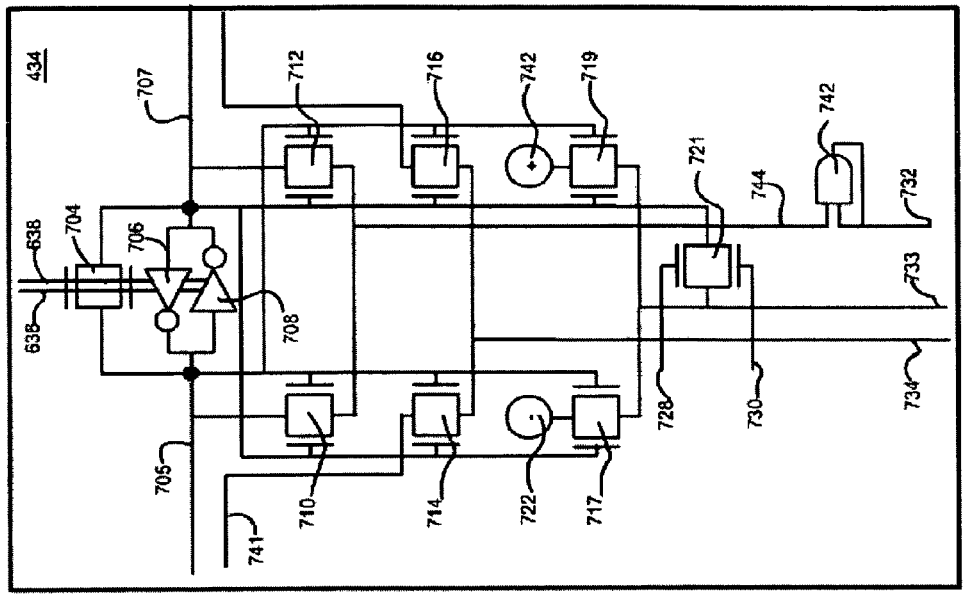
FIG. 7 illustrates a schematic diagram of a router circuit, which can be implemented in accordance with a preferred embodiment.
Figure 7:
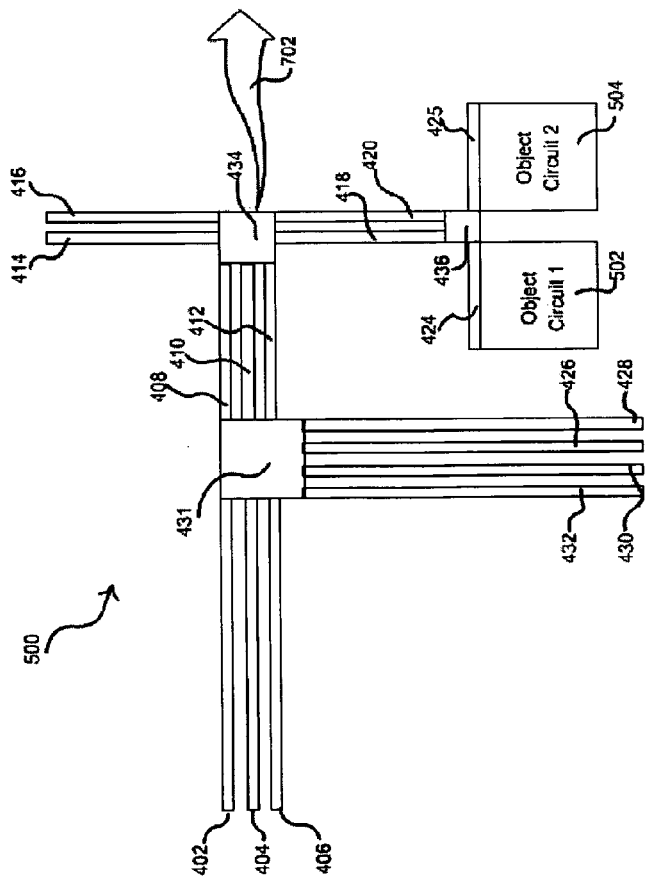

FIG. 7 illustrates a schematic diagram of a router circuit 700, which can be implemented in accordance with a preferred embodiment. Every router circuit can be identical in function to that shown in FIG. 6, of course with the exception that additional address bits must be routed for lower-level router circuit. In other words, each lower-level router circuit can require two addition pass gates. FIG. 7 details a level N−1 router node circuit 700. The N−1 router circuit forms the next-to-last router circuit in the fractal tree, as depicted in FIG. 7. Router circuit 700 includes a plurality of pass gates 704, 710, 712, 714, 716, 717, 719, and 721.

Two tri-state inverters 706 and 708 can also be implemented as a part of the router node circuit 700. The output from inverter 706 can be connected to the input of inverter 708 and also to a left branch recognition trigger electrode 705. In a similar manner, the output from inverter 708 can be connected to the input of inverter 706 and to a right branch trigger electrode 707. A left branch address bit 1 electrode 741 can be provided to pass gate 714 as indicated in FIG. 7. Additionally, first and second teach electrodes 728 and 730 can be connected to pass gate 721. The pass gate 710 can also be connected to pass gate 712.

Pass gate 714 can be connected to pass gate 716 and address bit electrode 734. Address bit 2 electrode 733 can be connected to pass gates 717 and 719. Both pass gates 717 and 719 can be connected to pass gate 721. A recognition trigger electrode 732 can also be connected NAND gate 742. NAND gate 742 can also be connected to electrode 744. In the example depicted in FIG. 7, a voltage source 742 can be provided to pass gate 719 as a "high" voltage value (i.e., +1). A voltage source 722 can also be provided to pass gate 717 as a "low" voltage value (i.e. −1).

FIGS. 6 and 7 thus provide respective circuits 600 and 700, which can be compared to one another. As the recognition trigger signal propagates down a fractal tree, one bit of information can be added to the fractal tree's output electrodes indicating the direction from which the signal came, in addition to routing the address bits sent from higher router nodes. Each router node requires two additional pass gates to route the signal, or four additional transistors per additional lower level router level.

Figure 8:
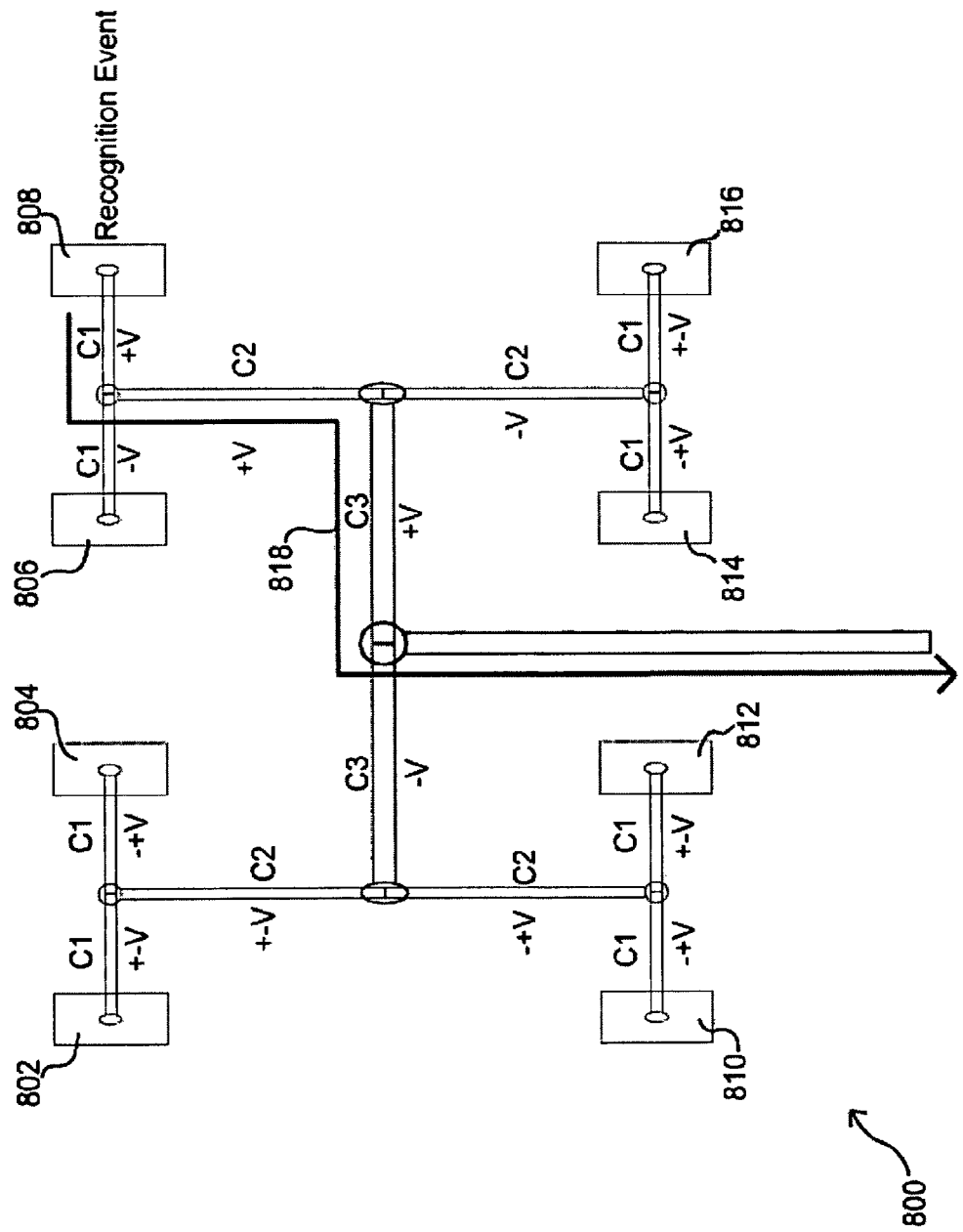
FIG. 8 illustrates a schematic diagram of a voltage reset mechanism that be implemented in accordance with a preferred embodiment.

FIG. 8 illustrates a schematic diagram of a reset mechanism that may be implemented in accordance with a preferred embodiment. FIG. 8 depicts a fractal tree 800 having a plurality of object circuits 802-816. Such nodes are generally analogous to the object circuits depicted in the fractal tree 300 of FIG. 3 and can be configured as pattern-recognition circuitry. As a recognition event propagates down the fractal tree, such as fractal tree 800 depicted in FIG. 8, the recognition trigger electrodes are driven to complimentary voltages at a router node via positive feedback circuits.

Because every right-branch electrode has a complimentary left-branch electrode that shares both size and layout, the capacitances will be equal in value and thus the magnitude of the charge stored on the capacitors will be equal. When the positive feedback circuits are deactivated and the pass-gates are opened, charge sharing between the two electrodes will result in the voltage being reset to a value midway between the supply rails. The complimentary voltage reset mechanism is illustrated generally in FIG. 8 with an example recognition event occurring at the [101] object circuit address.

For example, consider the recognition event as depicted in FIG. 8. The end electrodes each posses a capacitance C1. The first node router circuit will saturate each electrode at complimentary values +V and −V. The same will occur at the next node, where these branches have capacitances C2, and so on down the fractal tree. In all cases but the first recognition event path, not much information about the voltage of the electrodes is known other than the fact that they are complimentary. When the pass gates are opened, for instance 604 in FIGS. 6 and 704 in FIG. 7, the charge on complimentary electrodes will balance out and provide an efficient reset mechanism across the entire chip, as illustrated by following equations:

$$Q1 = C_1 V^+$$

$$Q2 = C_2 V^-$$

$$Q_{total} = C_1 V^+ + C_2 V^-$$

$$C_1 = C_2 = C$$

$$Q_{total} = +CV^+ CV^- = C(V^+ + V^-) = 0$$

Object circuitry can take a variety of forms. Such functionalities can be described in the context of, for example, a Knowm™ enabled synapse device and/or a molecular-switch-enabled circuit. A variety of object circuits are possible and it is intended that the varying embodiments disclosed herein generally cover such possibilities.

Figure 9:
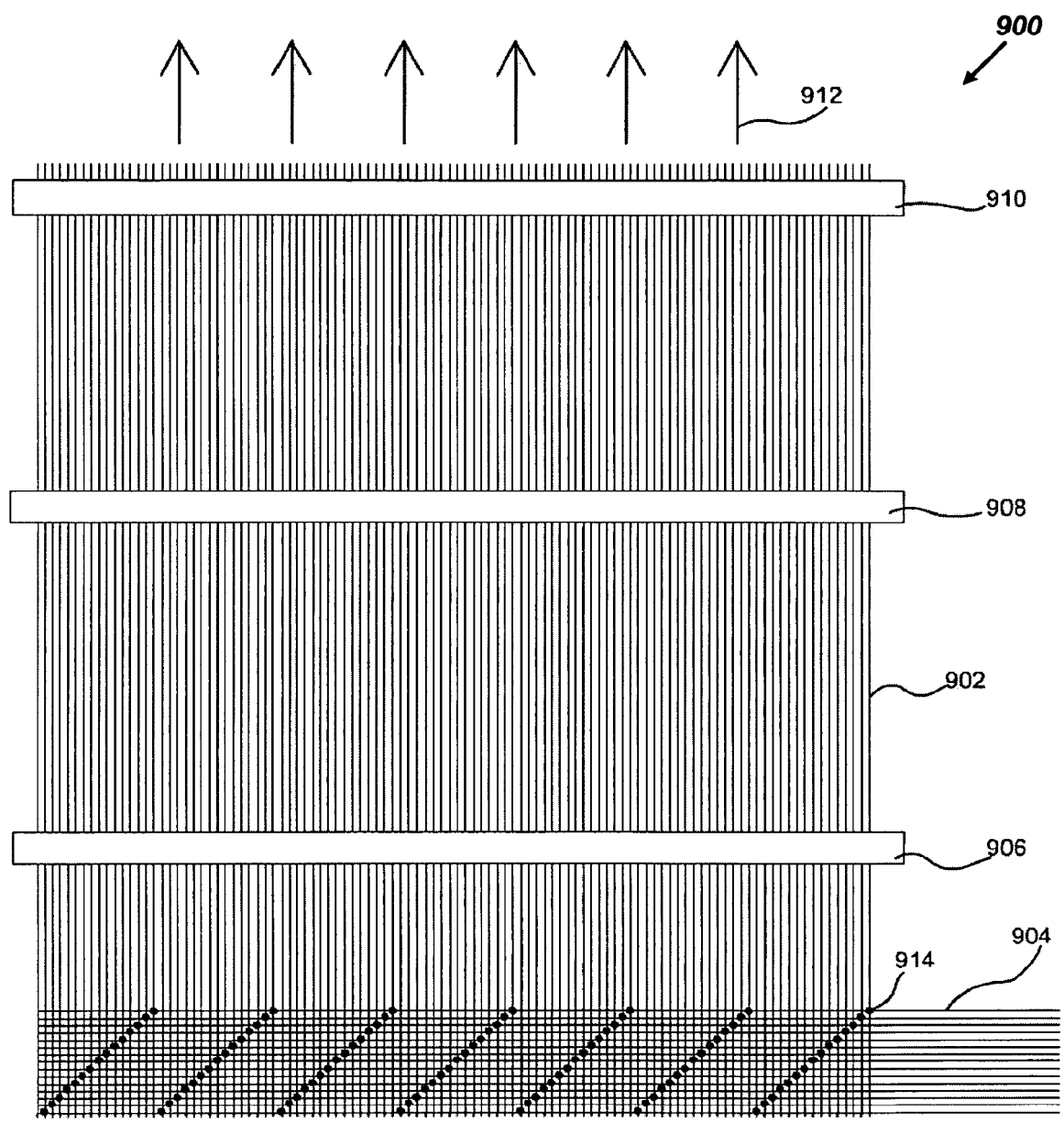
FIG. 9 illustrates a input broadcast layer schematic diagram of electrodes and support circuitry that can be adapted for use with one or more object circuits in accordance with a preferred embodiment.

In a distributed pattern-recognition embodiment, the uppermost layers duplicate a signal and broadcast it to every object circuit. These electrodes can form pre-synaptic electrode terminals. Such electrodes are demonstrated in the example depicted in FIG. 9, which illustrates a schematic diagram of a plurality of duplicated electrodes 902. Input electrodes 904 are duplicated many times with metal vias 914 to form broadcast electrodes 902. Electrodes 902 may be buffered at various portions across the chip, as indicated by blocks 906, 908 and 910. This pattern may be repeated, as indicated by arrows 912.

Figure 10:
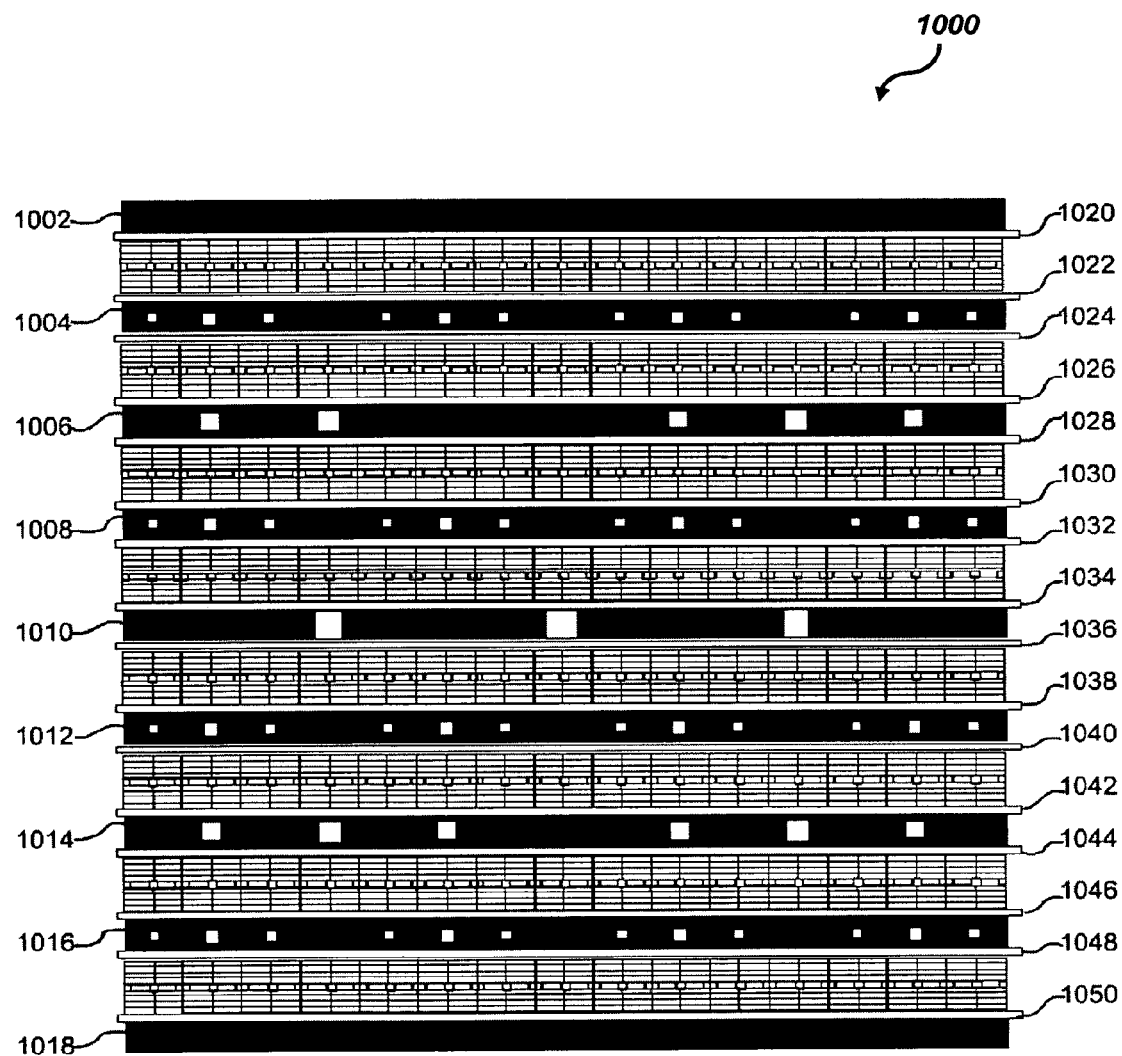
FIG. 10 illustrates a schematic diagram of a circuit layout with potential input buffer circuit locations in accordance with a preferred embodiment.

For the purpose of properly broadcasting electrical signals across a chip it is usually beneficial to provide buffer circuitry. FIG. 10 illustrates a schematic diagram of a chip layout of a circuit 1000 with possible buffer locations in accordance with a preferred embodiment. As indicated in FIG. 10, buffer circuitry may be allocated to the active layer highlighted in black and labeled by numerals 1002-1018. In addition, buffer circuitry may be allocated to the active layer, as indicated by numerals 1020-1050. Buffer circuitry may be used, for example, to buffer the input broadcast electrodes and clock lines.

When a signal is duplicated and broadcast over the surface of the chip, neural circuit modules integrate the signal via synaptic connections formed at the intersections of the input layer electrodes and a metal layer immediately beneath the electrode. These electrodes, or "dendrites", can be seen in greater detail in FIG. 11, which is described below.

Figure 11:
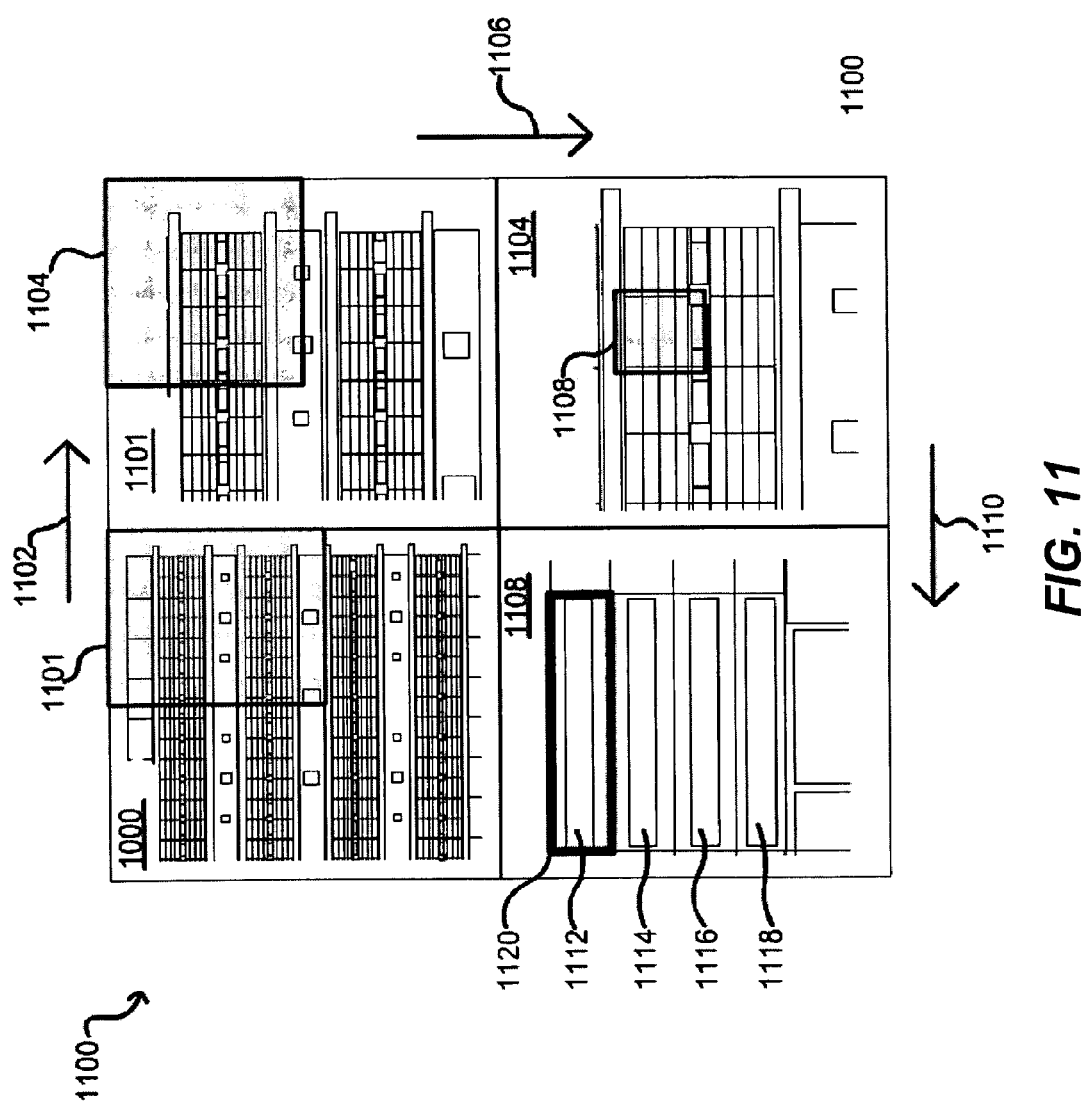
FIG. 11 illustrates a circuit layout including dendritic components in accordance with a preferred embodiment.

FIG. 11 illustrates circuit layout details including dendritic components in accordance with a preferred embodiment. Note that in FIGS. 10-11, identical or similar parts or elements are generally indicated by identical reference numerals. A portion 1100 of the layout for circuit 1000 is therefore depicted in FIG. 11. Portion 1101 is shown in greater detail as indicated by arrow 1102. A portion 1104 of the portion 1101 of circuit 1000 is depicted in FIG. 11. Portion 1104 is shown in greater detail as indicated by arrow 1106. A portion 1108 of circuit portion 1104 is then shown in greater detail as indicated by arrow 1110.

In the final detail view of portion 1108, electrodes 1112, 1114, 1116, and 1118 can be seen. Electrodes 1112, 1114, 1116, and 1118 can constitute for example, a dendritic electrode (i.e., metal layer 4). Thus, as previously mentioned, the dendritic electrodes 1112, 1114, 1116, and/or 1118 comprise the metal layer immediately beneath the input layer electrodes (i.e., metal layer 5). Each dendrite can be connected to one neural node. For illustrative purposes, neural node 1120 may be connected to dendritic electrode 1112 with a series of vertical connections through the chip layers. These connections can be seen in FIG. 12, which depicts a cross-sectional view of a neural node, for example neural node 1120 in FIG. 11.

Figure 12:
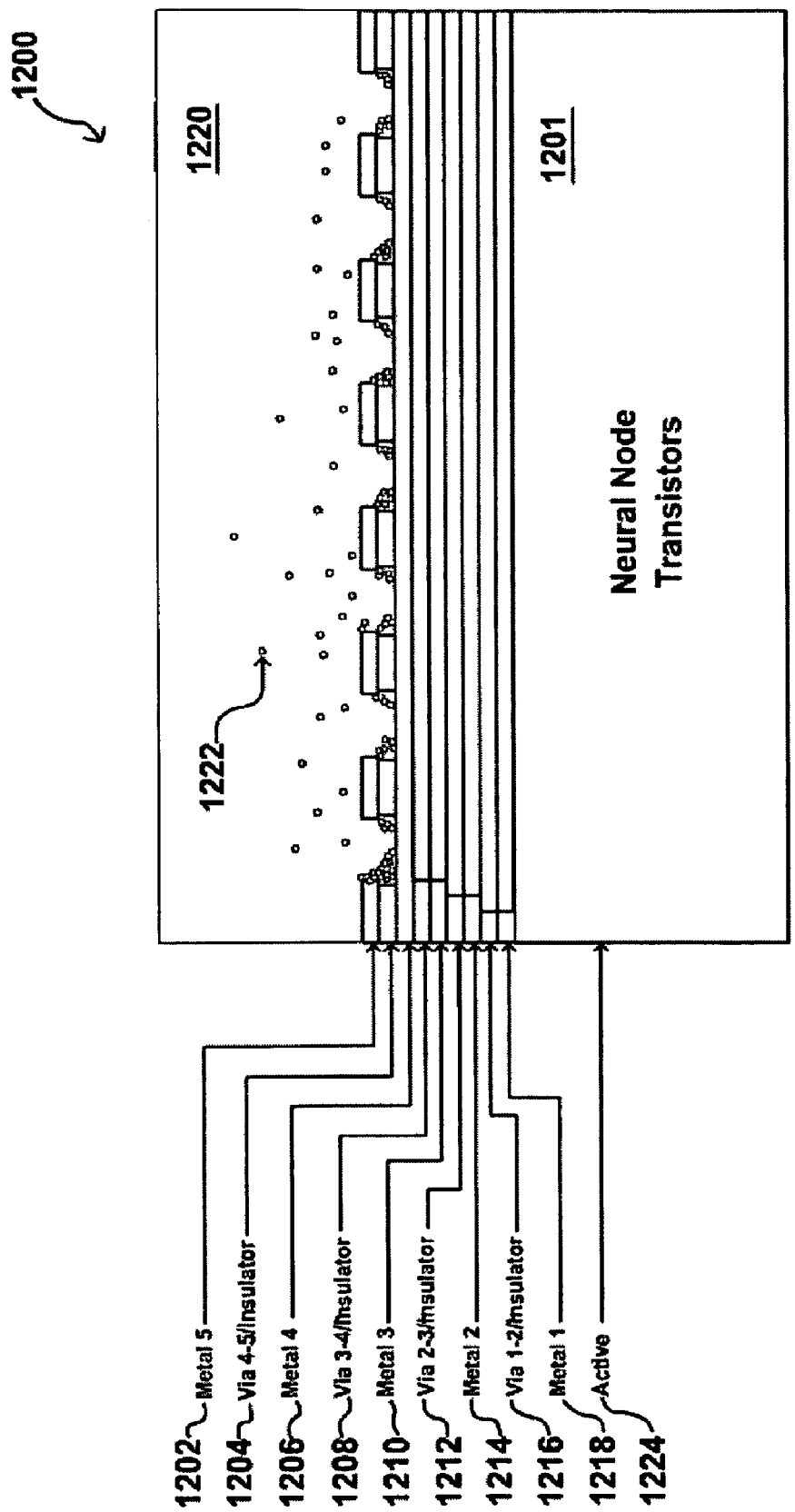
FIG. 12 illustrates a cross-sectional side view of a neural node device that can be implemented in accordance with a preferred embodiment.

FIG. 12 illustrates a cross-sectional view of neural node circuitry 1200 that can be implemented in accordance with a preferred embodiment. In general, the circuitry 1200 is composed of neural node transistors 1201, which can constitute, for example, part of a neural node circuit that integrates signals arriving through its synapses. Neural circuitry 1200 can be implemented based on a number of physical neural network designs, particularly implementations based on nanotechnology-based components.

The neural node 1200 circuitry disclosed in FIG. 12 is generally composed of a plurality of molecular particles or nanoparticles 1222 disposed within an area filled with a liquid 1220. A plurality of layers can be formed between the active layer 1224 and the liquid layer 1220. For example a layer 1218 (i.e., metal layer 1) can be formed above the neural circuitry 1201. A via 1216 (i.e., 1-2 Via) can be formed above layer 1218 and a layer 1214 (i.e., metal layer 2) formed above via 1216. A via 1212 (i.e., 2-3 Via) can be formed above layer 1214 and a layer 1210 (i.e., metal layer 3) formed above via 1212.

Additionally, a via 1208 (i.e., 3-4 via) can be formed above layer 1210, while a layer 1206 (i.e., metal layer 4) can be formed above layer 1208. Additionally, a via 1204 (i.e., 4-5 via) can be formed above layer 1206. Finally, an input layer 1202 (i.e., metal layer 5) can be formed above layer 1204. Layer 1206 can be utilized to implement the dendritic electrodes (i.e., metal layer 4) illustrated in FIG. 11. The configuration depicted in FIG. 12 can thus be utilized to provide the features depicted in FIGS. 10-11.

The basic requirement of a neural node circuit is the ability to implement the flip-lock cycle, which has been detailed in other patents. The flip-lock cycle is the process of inverting either the pre- or post-synaptic electrode for a period of time and locking either the post- or pre-synaptic voltage (respectively) so as to implement a form of competitive Hebbian learning across a junction of meta-stable switches.

Figure 13:
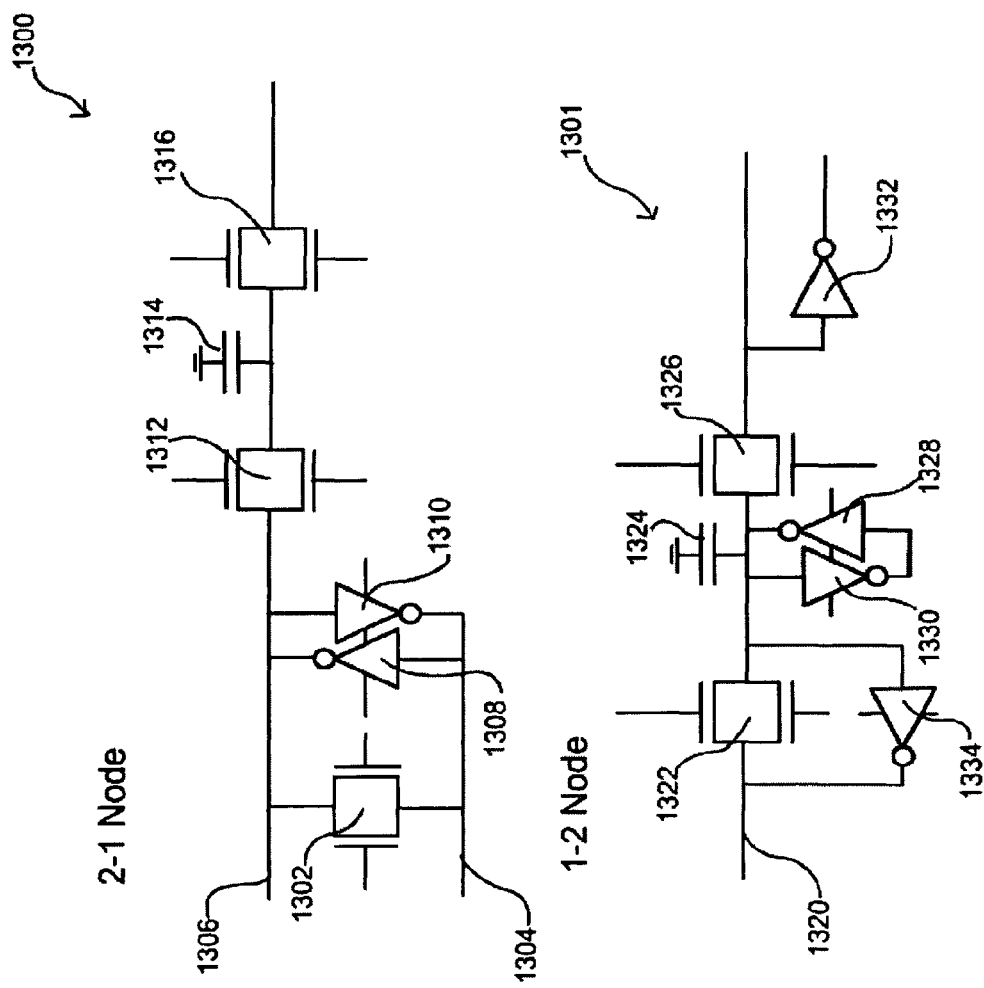
FIG. 13 illustrates a schematic diagram of example neural node circuits that can be implemented in accordance with a preferred embodiment.

By combining differential connections, a bi-stable synapse component can be created from meta-stable switches. For the benefit of the reader two such example circuits are depicted in FIG. 13, which illustrates a schematic diagram of example neural node circuits 1300 and 1301 that can be implemented in accordance with a preferred embodiment. Circuit 1300 can be implemented as a 2-1 neural node circuit, while circuit 1301 can be implemented as a 1-2 neural node circuit. The 2-1 neural node circuit 1300 is composed generally of a pass gate 1302 that is connected to a first post-synaptic electrode 1306 and a second post-synaptic electrode 1304.

Two tri-state inverters 1308 and 1310 can also be provided, such that the output of inverter 1308 is connected to post-synaptic electrode 1306 and the input of inverter 1308 is connected to post-synaptic electrode 1304. Likewise, the input of inverter 1310 is connected to post-synaptic electrode 1306 and the output of inverter 1310 is connected to post-synaptic electrode 1304. A pass gate 1312 can also be connected to post-synaptic electrode 1306. A pass gate 1316 can also be provided. An electrode can be formed between pass gates 1312 and 1316 with a capacitance 1314.

Neural node circuit 1301 includes pass gates 1322 and 1326, along with tri-state inverters 1330 and 1328. If the output of the neural node is to be fed to another 2-1 neural node, the output may be inverted by inverter 1332. The input of tri-state inverter 1334 may be connected to post-synaptic electrode 1320. A post-synaptic electrode 1320 is connected to pass gate 1322. The input of inverter 1328 and the output of inverter 1330 are connected to an electrode with capacitance 1324 and to pass gates 1322 and 1326.

The configurations depicted in FIG. 13 indicate more than one type of neural node circuit can be implemented, depending upon design goals and other such considerations. In fact many other types of neural node circuits can be provided. For the sake of simplicity, however, these other circuit types are not discussed here and reference is made to the basic configurations depicted in FIG. 13. Dendritic electrodes (post-synaptic electrodes) depicted in FIG. 11 and FIG. 12 illustrates single post-synaptic electrodes consistent with the neural node circuit 1301 of FIG. 13.

A number of examples can be provided based on neural node circuits 1300 or 1301. For example, a 2-2 node can be provided that receives at least two inputs and returns at least two outputs. A flip-lock cycle can be determined that is relatively simple and in its most basic form comprises one complete clock cycle. Both circuits 1300 and 1301 can be analyzed with respect to two clock periods, including an evaluate phase, a first feedback phase, a second feedback phase and a reset phase.

The 2-1 neural node circuit 1300 contains two post-synaptic electrodes 1304, 1306. Synapses can form on these two electrodes 1304, 1306 from a perpendicular pre-synaptic electrode. A synapse can thus be seen as a differential connection, where the sign of the connection is a function of the relative sizes of the connections on each electrode. The post-synaptic electrodes each charge via the current from the synaptic junctions. Pass gate 1312 is deactivated (non-conducting) during the evaluate phase.

The 1-2 neural node circuit 1301 contains one post synaptic electrode 1320. Synapses can form on electrode 1320 from two perpendicular pre-synaptic electrodes. A synapse can thus be seen as a differential connection, where the sign of the connection is a function of the relative sizes of the connections on the electrode. The post-synaptic electrode charges via the current from the synaptic junctions during the evaluate phase. Pass gate 1322 is conducting and pass gate 1326 is non-conducting during the evaluate phase. Note that the purpose of the evaluate phase is to provide a seed voltage on the capacitor 1324, which will be evaluate to a saturated level by the feedback circuit composed of inverters 1336 and 1328.

The first feedback phase (i.e., Feedback 1) for the 2-1 node neural circuit 1300 occurs after the post-synaptic electrodes 1304 and 1306 have partially charged, and tri-state inverters 1308 and 1310 are activated. This forces the electrode at the highest potential to saturate at the high supply rail and forces the other electrode to saturate to the complimentary supply rail. The pass gate 1302 is non-conducting during this stage. The temporal integral of the energy density across the pre- and post-synaptic electrodes over the evaluate and feedback stages gives the probability of total synaptic update. The mechanism for the synaptic update and its connection to a computationally useful plasticity rule is covered in other patents. For the sake of clarification to the reader, each synapse is composed of an array of meta-stable switches, for example a Knowm™ synapse or molecular switches. Pass gate 1312 remains conducting during this stage while pass gate 1316 remains non-conducting.

The first feedback phase for the 1-2 neural node circuit 1301 occurs after the post-synaptic electrode 1320 has charged, pass gate 1322 is de-activated (non-conducting), and tri-state inverters 1328 and 1330 are turned on. Inverter 1334 is turned on, thus forcing the post-synaptic voltage state to an opposite value as required by the flip-lock cycle. In other words, the flip state for the 1-2 neural node circuit 1301 is implemented by the pre-synaptic electrode 1320. The temporal integral of the energy density across the pre- and post-synaptic electrode provides for a total synaptic update. The mechanism for the synaptic update is covered in other patents, for example "plasticity-induced self-organizing nanotechnology for the extraction of independent components of a data stream". For the sake of clarification to the reader, each synapse can be composed of an array of meta-stable switches, for example, Knowm™ synapses or a molecular switches. The pass gate 1326 remains non-conducting during this stage and pass gate 1322 remains conducting.

With respect to the 2-1 neural node circuit 1300 and the second feedback phase, pass gate 1302 remains off and pass gate 1312 is off. Pass gate 1316 is made conducting, thus dumping the charge stored between pass gates 1312 and 1216 out of the neural node. The feedback from inverters 1308 and 1310 is turned off during the second feedback phase.

With respect to the 1-2 neural node circuit 1301 and the second feedback phase, pass gate 1322 remains non-conducting. The feedback from inverters 1328 and 1330 turn off. Pass gate 1326 turns on, thus dumping the charge accumulated between pass gates 1322 and 1326 out of the neural node circuit 1301.

During the reset phase for the 2-1 neural node circuit 1300, pass gate 1302 is turned on. Inverters 1308 and 1310 remain off. Pass gates 1312 and 1316 are turned on. The effect is to share the charge across all electrodes. Since the device is capacitively balanced, an equal amount of positive and negative charge results in a voltage reset that takes all electrodes to a zero value.

With respect to reset phase for the 1-2 neural node circuit 1301, pass gate 1322 and 1326 is turned on. Inverters 1328 and 1330 remain off. The effect is to share the charge across all electrodes. Since the device is capacitively balanced, an equal amount of positive and negative charge result is a voltage reset that takes all electrodes to a zero value.

To detect the presence of a feature it may be necessary to assign many neural nodes to each pattern recognition circuit. Object circuits are thus configured as pattern recognition circuits. Each pattern recognition circuit can thus be composed of one or more neural nodes. Each neural node can operate under the auspices of the Anti-Hebbian and Hebbian (AHAH) rule via the Flip-Lock cycle. The use of the AHAH rule in such circuits is disclosed in U.S. Patent Publication No. 20040162796, entitled "Application of Hebbian and Anti-Hebbian learning to Nanotechnology-based Physical Neural Networks," by Alex Nugent, which published on Aug. 19, 2004 based on a patent application filed on Dec. 30, 2003. Under a full basis set of binary inputs, the AHAH rule allows 2N attractor states, where N in the number of inputs to the neuron. Each attractor state passes or inverts one of the input lines. A pattern recognition circuit can be constructed as depicted in FIG. 14.

Figure 14:
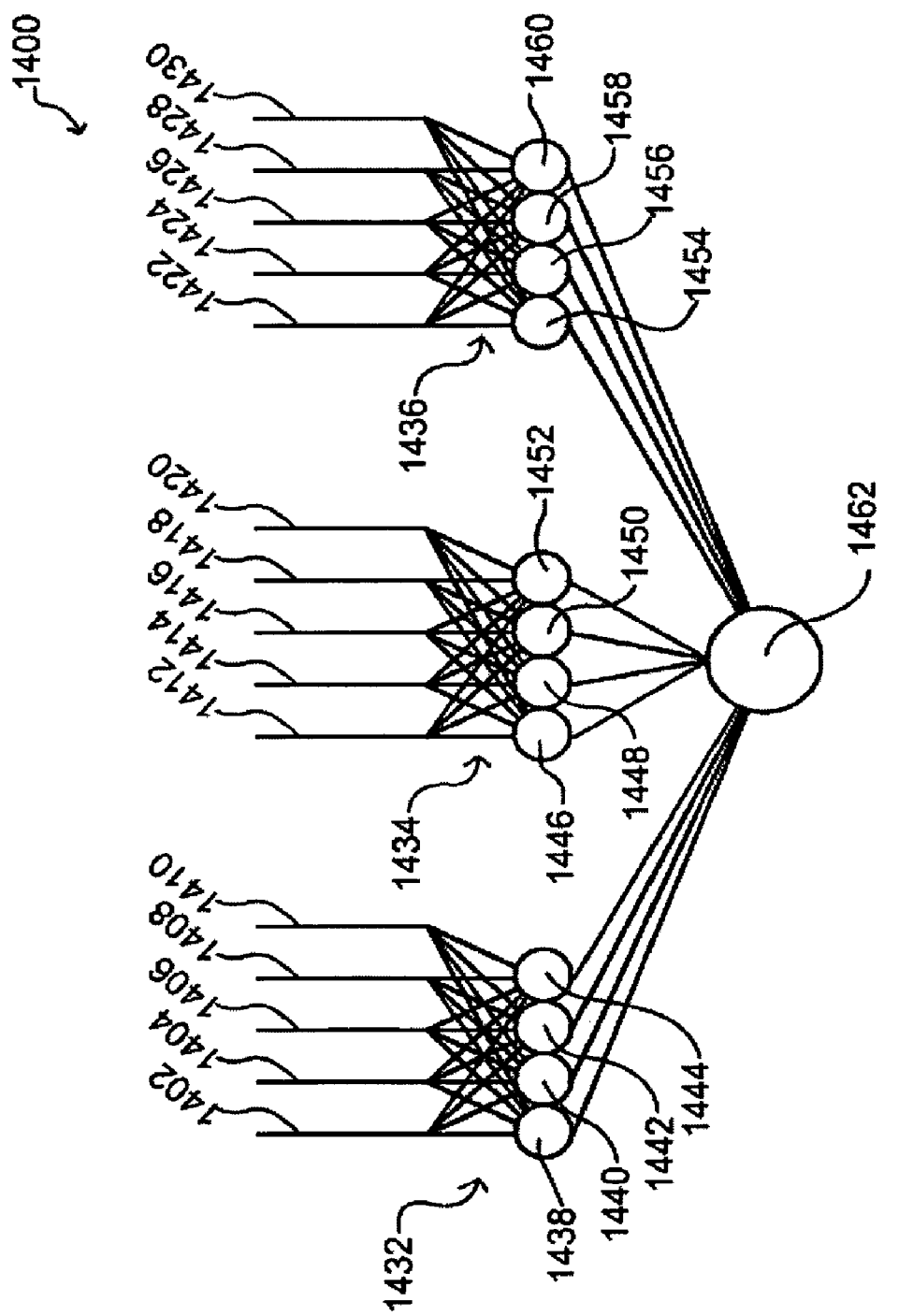
FIG. 14 illustrates a schematic diagram depicting an ensemble of ensembles of neural nodes in the context of an object circuit configured as a pattern recognition circuit, which can be implemented in accordance with a preferred embodiment.

FIG. 14 illustrates a schematic diagram depicting a group 1400 of neural nodes in the context of a pattern recognition circuit, which can be implemented in accordance with a preferred embodiment. The group 1400 of nodes is generally composed of nodes 1438-1460. Inputs 1402-1410 are respectively input to nodes 1438-1444 via synaptic connection matrix 1432. Similarly, inputs 1412-1420 are respectively input to nodes 1446-1452 via synaptic connection matrix 1434. Likewise, inputs 1422-1430 are input to nodes 1454-1460 via synaptic connection matrix 1436. The outputs from nodes 1438-1460 are respectively provided to an ensemble node 1462. As depicted in FIG. 14, each node can receive a subset of the total inputs. The subsets depicted in FIG. 14, represented by synapse matrixes 1432-1426, are of course arbitrary and any connection pattern can be utilized.

Figure 15:
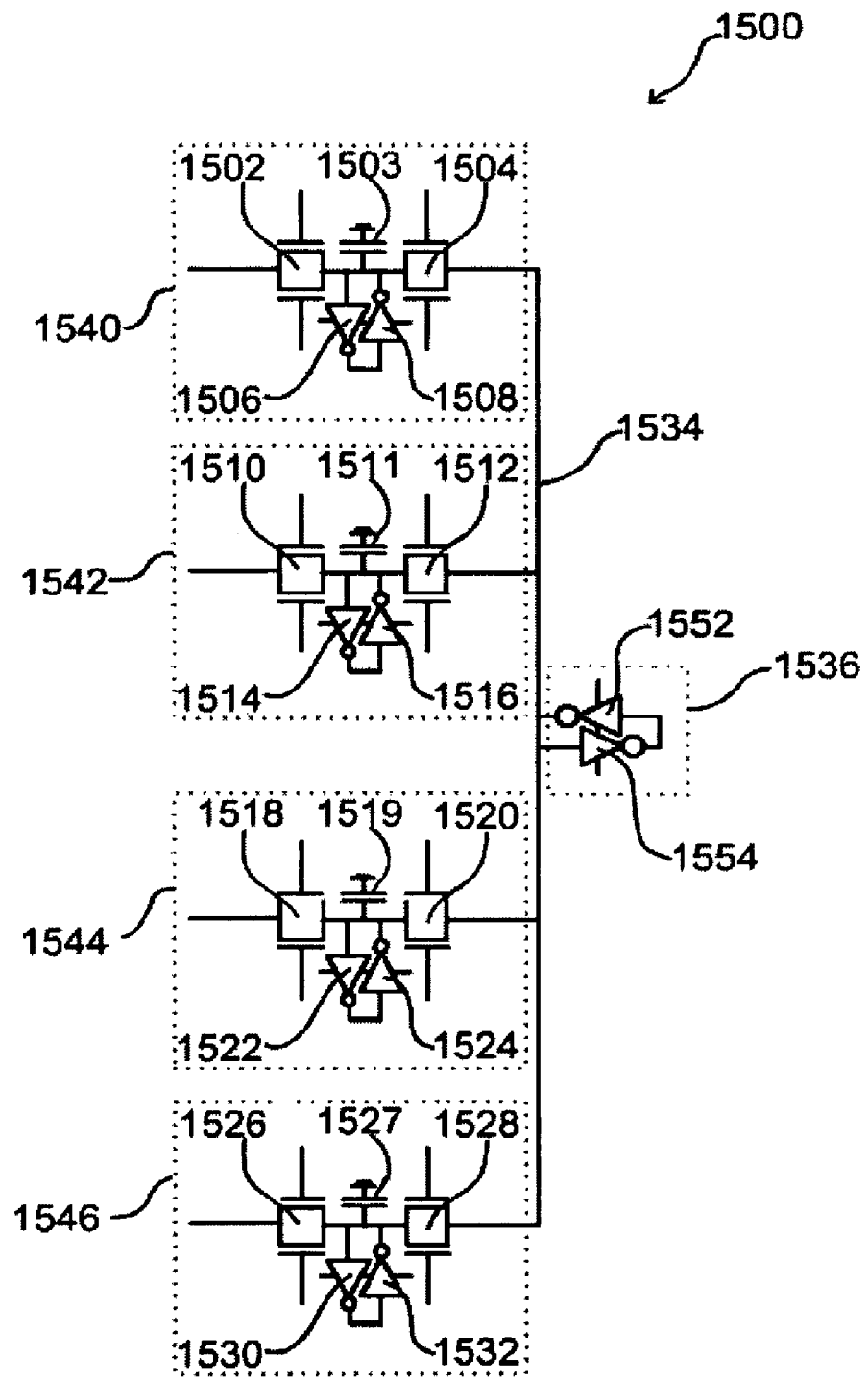
FIG. 15 illustrates a schematic diagram depicting an ensemble of neural node circuits which together form a portion of a object circuit configured as a pattern recognition circuit in accordance with a preferred embodiment.

During the Feedback 2 stage, a charge quanta on each node is released onto an ensemble electrode. The instantaneous voltage on the electrode is generally a direct measure of the accuracy of the pattern input with the stored synaptic weights. In other words, if a bit of an input pattern matched a neural state, the charge quanta would equal +Q, whereas if the charge quanta would equal −Q if it did not. FIG. 15 illustrates this process in greater detail.

FIG. 15 illustrates a schematic diagram depicting an ensemble circuit 1500 configured for pattern recognition in accordance with a preferred embodiment. Circuit 1500 generally includes one or more nodes 1540, 1542, 1544, and 1546. Node 1540 (i.e., Node 1) is composed of pass gates 1502, 1504 and inverters 1506, 1508 as well as an electrode with a capacitance 1503. Node 1542 (i.e., Node 2) is composed of pass gates 1510, 1512 and inverters 1514, 1516 as well an an electrode with a capacitance 1511. Node 1544 (i.e., Node 3) is composed of pass gates 1518, 1520 and inverters 1522, 1524 as well as an electrode with a capacitance 1519. Node 1546 (i.e., Node 4) is composed of pass gates 1526, 1528 and inverters 1530, 1532 as well as an electrode with a capacitance 1527. Nodes 1540, 1542, 1544, and 1546 are connected to an ensemble evaluation electrode 1534, which in turn is connected to an ensemble node 1536 that is composed of inverters 1552, 1554. The circuit 1500 depicted in FIG. 15 can be utilized to implement a portion of the configuration depicted in FIG. 14. For example, the ensemble nodes 1540-1546 depicted in FIG. 15 is analogous to the ensemble nodes 1438-1444 illustrated in FIG. 14. The synapse matrix has been omitted for clarity, but it should be noted that this matrix may be formed via a cross-bar arrangement of pre-synaptic electrodes, for example electrodes 1402-1410 in FIG. 14, and post-synaptic electrodes, for example electrodes 1540-1546 in FIG. 15.

It should be noted that an ensemble may contain upwards of thousands of neural modules, depending of the input dimension and the level of pattern recognition accuracy required. As previously mentioned, during the Feedback 2 stage each neural node dumps a quanta of charge onto the ensemble evaluation electrode. The voltage on the electrode is of course a function of the capacitance of the ensemble electrode and the amount of charge released by the node circuits. The voltage on the ensemble evaluation electrode is a function of the agreement between the input pattern and the states of each node in the ensemble.

Recall that the stable states of a neural node under the influence of the AHAH rule and a binary data stream is a connection that passes or inverts one of the node inputs. As an example, consider an input pattern of [1010]. If the ensemble node states were [[1---], [-0--], [--1-], [---0]], then the total output charge on the ensemble electrode would be equal to +4Q, where Q is the charge built up in each node between the node pass gates and [--1-] indicates null synaptic connection to the $1^{st}$, $2^{nd}$, and $4^{th}$ inputs and a positive connection (non-inverting) connection to the $3^{rd}$ connection.

Alternately, if the input pattern was [1000] and the ensemble node states were given as above, a total of +2Q of charge would be released onto the ensemble electrode. During the Feedback 2 cycle, the ensemble node feedback turns on, thus forcing the ensemble electrode voltage to either a high or low value. The more accurate the match between the input pattern and the ensemble neural state, the faster the ensemble electrode will saturate.

The first ensemble electrode voltage to reach a high value thus forms the recognition event that is propagated down the fractal tree through the router circuits. Since the distance from the ensemble electrode to the router circuits are identical, the circuit with the best match will beat the other nodes to the router circuit block and consequently the signal cascade results in the output of the address of the object circuit block with the closest match at the fractal trunk.

One can appreciate that the operation of this device is in fact quite simple. The extreme efficiency of the circuitry is a function of the type of problem it is trying to solve and the ability of the problem to be solved in a completely parallel way.

Figure 16:
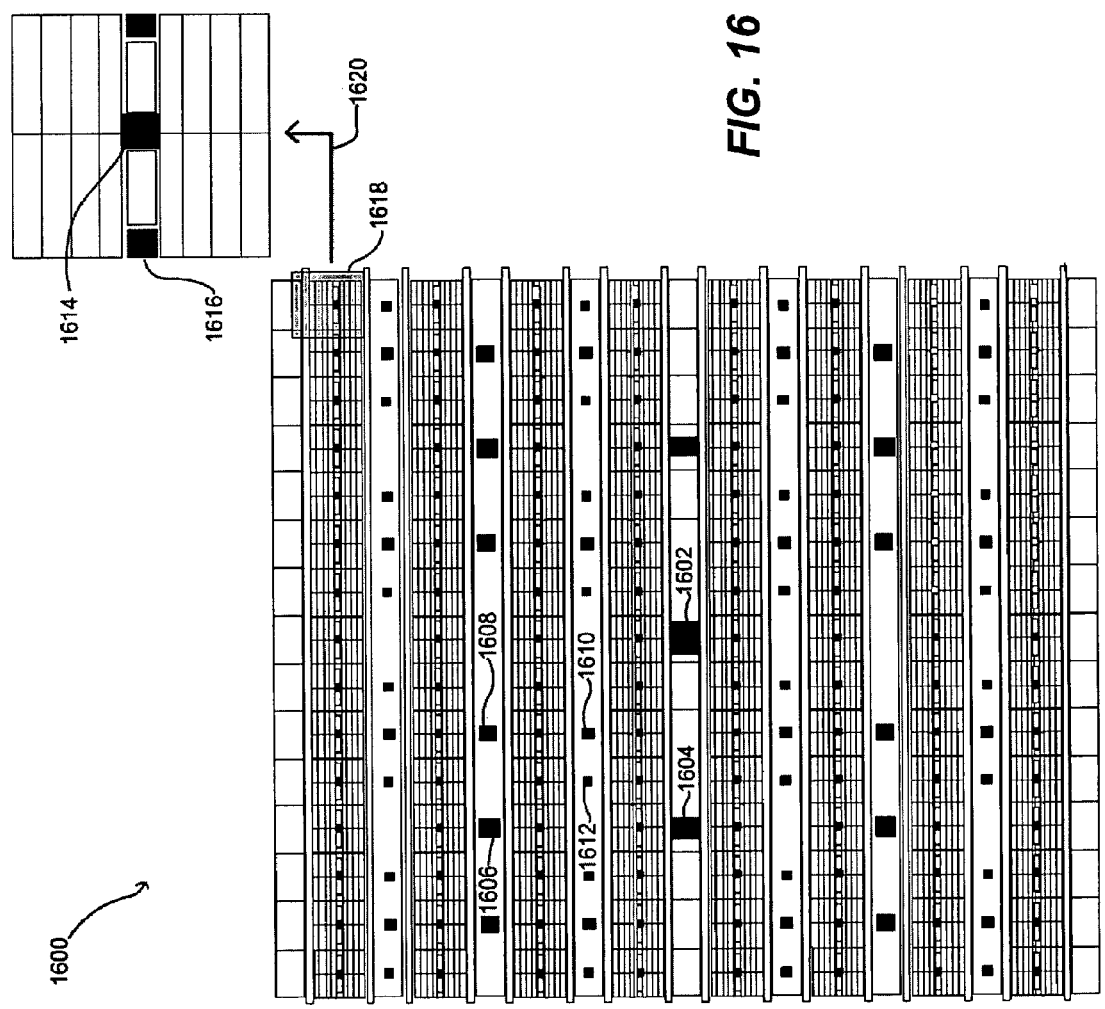
FIG. 16 illustrates active chip area router circuit allocations in accordance with a preferred embodiment.

FIG. 16 illustrates a chip layout for a sample circuit 1600 including allocations on the active layer for router circuitry in accordance with a preferred embodiment. Allocations on the active layer for transistors required for router circuits are depicted as solid black squares. In general, a router circuit is required for every branch in the fractal tree. A plurality of router circuits thus exists with each router node responsible for the routing of a number of data lines determined by the branch level. Allocation 1602 can comprise a location for a Level 0 router circuit. Allocation 1604 can comprise a location for a Level 1 router circuit. Allocation 1606 can comprise a location for a Level 2 router circuit.

Allocation 1608 can comprise a location for a Level 3 router circuit. Allocation 1610 can comprise a location for a Level 4 router circuit. Allocation 1612 can comprise a location for a Level 5 router circuit. Allocation 1612 can comprise a location for a Level 6 router circuit. Allocation 1614, as depicted by an enlargement of segment 1618, can comprise a location for a Level 7 router circuit. Allocation 1616 can comprise a location for a Level 8 router circuit. The depicted 8 levels of router circuitry are of course arbitrary and more, or less, levels may exist. As depicted in FIG. 16, the area on the chip 1600 required for the routing circuitry transistors is a relatively small portion of the total chip area and in fact fills an exponentially less proportional area of the chip as the number of router levels increases.

Figure 17:
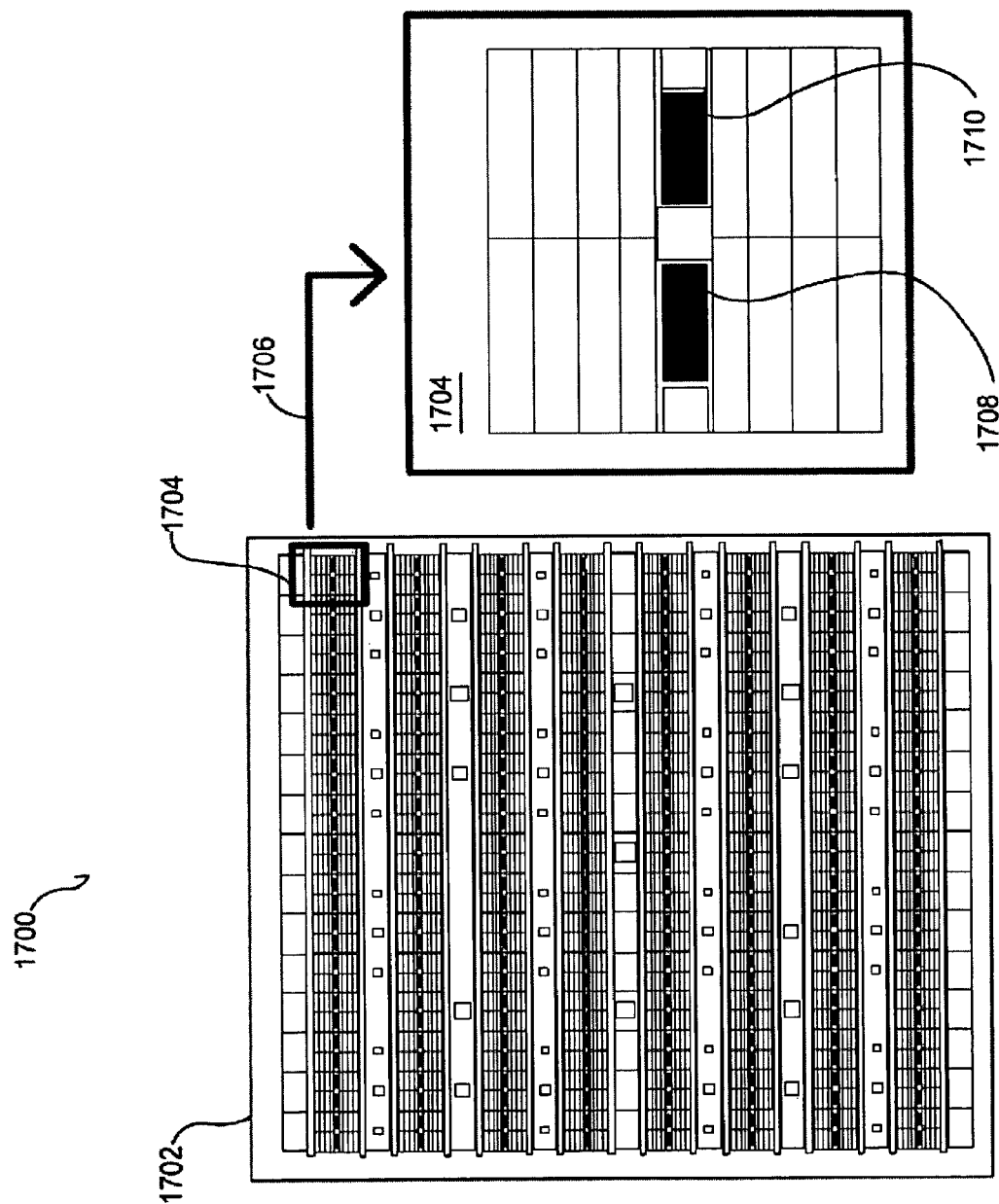
FIG. 17 illustrates active chip area ensemble node circuit allocations for the circuit depicted in FIG. 15 in accordance with a preferred embodiment.

FIG. 17 illustrates a chip layout for active chip area allocations for ensemble node transistors in accordance with a preferred embodiment. A magnification of a section 1704 is evidence by arrow 1706. Allocations 1708 and 1710 may comprise allocations on the active chip area for ensemble circuit transistors.

Figure 18:
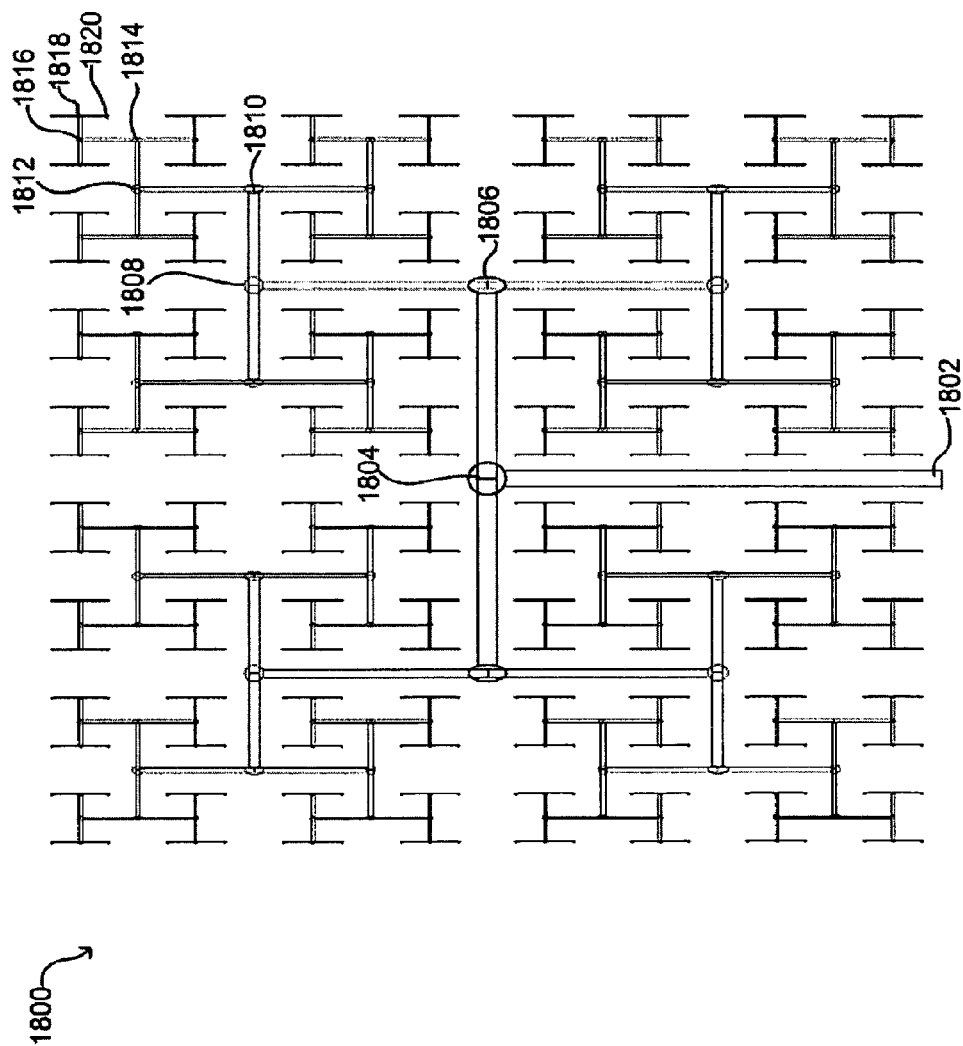
FIG. 18 illustrates a fractal output layer in accordance with a preferred embodiment.

FIG. 18 illustrates an output layer for a fractal memory apparatus. Output layer 1800 may comprise a fractal truck 1802. Router circuit locations have been marked with a circles, as evidenced by level 0 router circuit 1804, Level 1 router circuit 1806, Level 2 router circuit 1808, Level 3 router circuit 1810, Level 4 router circuit 1812, Level 5 router circuit 1814, Level 6 router circuit 1816, Level 7 router circuit 1818 and Level 8 router circuit 1820. The function of a fractal memory apparatus depends on every object circuit being the same distance from the fractal trunk across electrodes of near-identical conduction properties.

The fractal structure of the output electrodes and router circuitry is thus critical to device function because it satisfies this condition. The fractal structure illustrated in FIG. 18 is incredibly interesting in that the linear decrease in branch width results is an incredibly efficient means to both broadcast a signal and receive a signal to and from every part of the chip in the same time interval. This output layer 1800 comprises most of one metal layer, for example metal layer 3, and small portions of another metal layer, for example metal layer 4, for the branch nodes.

As previously mentioned, the charge output of a neural ensemble circuit block configured for pattern recognition is related to the degree the input pattern matches the stored pattern. This charge is the seed in a positive-feedback circuit that evaluates to one of two stable states. The closer the match of the pattern with the states of the neural nodes, the higher the seed charge and the shorter the time the ensemble circuitry will take to saturate the ensemble electrode at a high voltage. This high voltage thus starts a chain reaction down the fractal tree.

The ensemble electrode to saturate first will "win the race" down the fractal tree, resulting it its fractal address being displayed as voltages on the fractal trunk electrodes. It can be appreciated that the time between pattern presentation and the occurrence of an address at the fractal trunk is a direct measure of the degree of match between the input pattern and a stored patter. In this way one may retrieve not only the address of the most-likely match but also the degree of certainty related to the returned match.

The speed of this signal transduction is a function of the degree of matching between an input pattern and a stored pattern, but can also be affected by two circuits on the fractal tree having the same stored pattern. In this case, the signals will reach a router node at the same time. The feedback circuit will attempt to amplify the signals to make a decision. Without voltage noise, however, the time the router takes to switch may take too long. Since voltage noise is of course in no short abundance, especially at elevated operating temperatures, the circuit will randomly pick a branch and output the corresponding address. This problem can be avoided by careful initialization of the device, which entails nothing more than insuring each object circuit is initialized into a different state.

FIG. 18 and the previous figures thus provide a fractal architecture that has a relationship to distributed computing. A fractal architecture is not necessarily limited to only pattern recognition embodiments, nor does the input need to be broadcast simultaneously to every object circuit. The object circuitry may comprise arbitrary logical circuits or even microprocessors. This is illustrated, for example, in FIG. 20.

Figure 19:
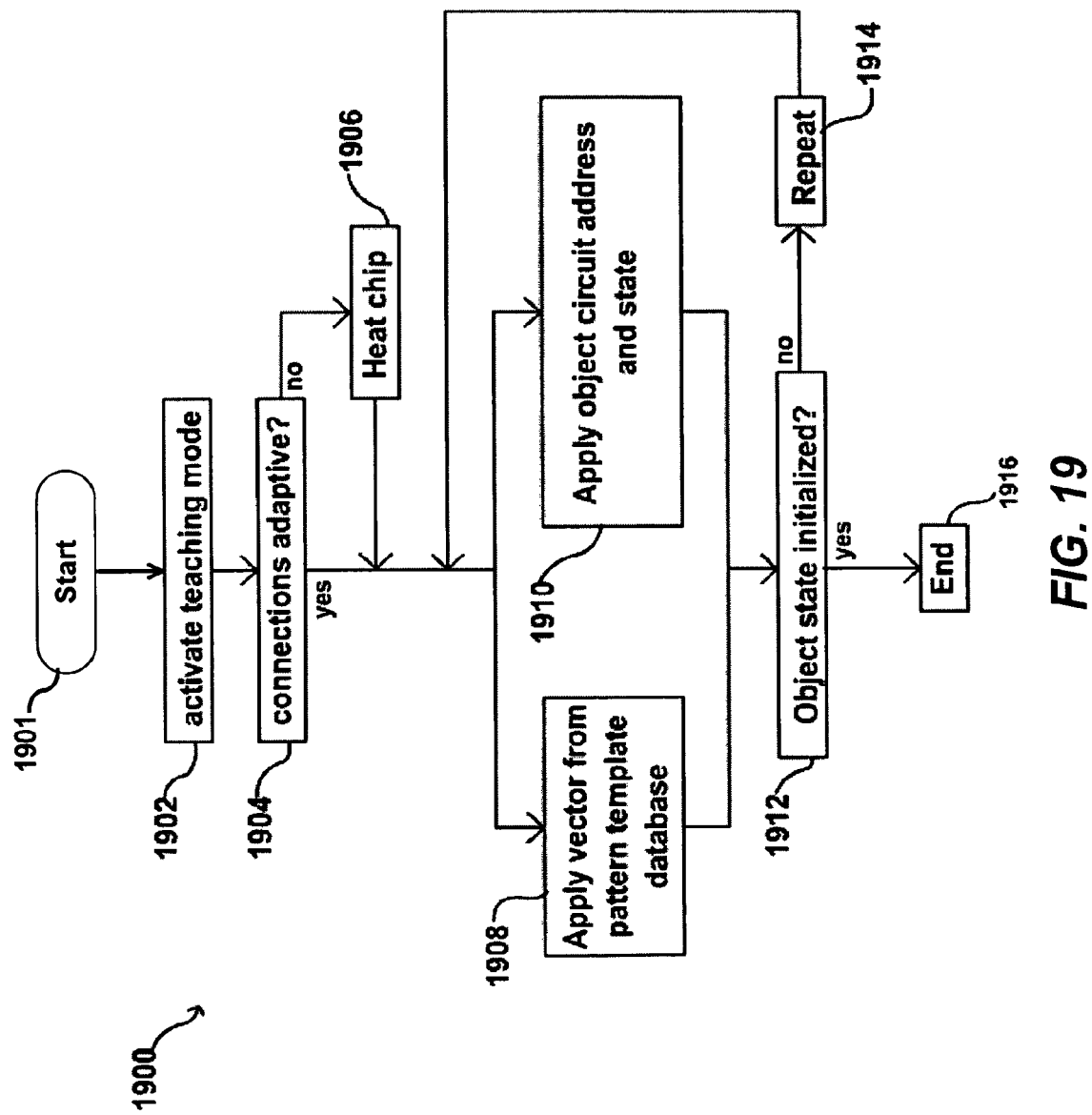
FIG. 19 depicts a high-level flow chart of operations depicting logical operational steps that can be implemented for initializing the neural node states of an object circuit configured as a pattern recognition circuit, in accordance with a preferred embodiment.

FIG. 19 depicts a high-level flow chart 1900 of operations depicting logical operational steps that can be implemented for initializing the neural node states of an object circuit configured as a pattern recognition circuit, in accordance with a preferred embodiment. The process begins as indicated by block 1901. Thereafter, as indicated at block 1902, a teaching mode can be activated. Activating the teach mode can entail activating the teach lines, for example, such as electrodes 728 and 730 depicted in FIG. 7 and electrodes 628 and 630 illustrated in FIG. 6. In addition, slight modifications can be made to the Feedback 1 cycle, as will be detailed shortly. Before the connections can be modified via the flip-lock cycle, they should be in an excited state capable of state transitions induced by, for example, heat and/or applied electric fields.

One example of a method that can be adapted for use in accordance with moving the connections into such an excited state is described in U.S. patent application Ser. No. 11/045, 538, "Solution-Based Apparatus of an Artificial Neural Network Formed Utilizing Nanotechnology." The nanoparticles comprising a Knowm™ synapse can be made mobile by heating the chip and thus transitioning the particle suspension medium from a solid to a liquid or from a high-viscosity state to a low-viscosity state. In addition, heating the chip may transition molecular switches from a stable to a meta-stable state. Heating can occur by an external heating apparatus or via normal chip operation, which is indicated by block 1906.

When the connections have reached an adaptive state, defined as a state susceptible to thermal-induced state transitions, input vector/object circuit address pair is applied to the chip, as indicated by blocks 1908 and 1910. The input vector may comprise an exemplar of a collection of various examples of a pattern to be learned. The address may be an object circuit assigned to learn the input pattern. If the state of the object circuit is positive then the object circuit address is specified. If the state of the object circuit is negative then the address of the complementary object circuit is specified.

For example, [0100111] and [0100110] are considered can be tested to determine if the state has been set. This test may be accomplished by de-activating the teach mode and presenting a series of input patterns. If the output of the object circuit agrees to a test measure to within some maximum allowable error then the object circuit state is considered set and the process is terminated, as indicated by block 1916. If the object circuit state is not set then the teach mode is activated and input vector/address pairs are applied, as indicated by block 1914.

Figure 20:
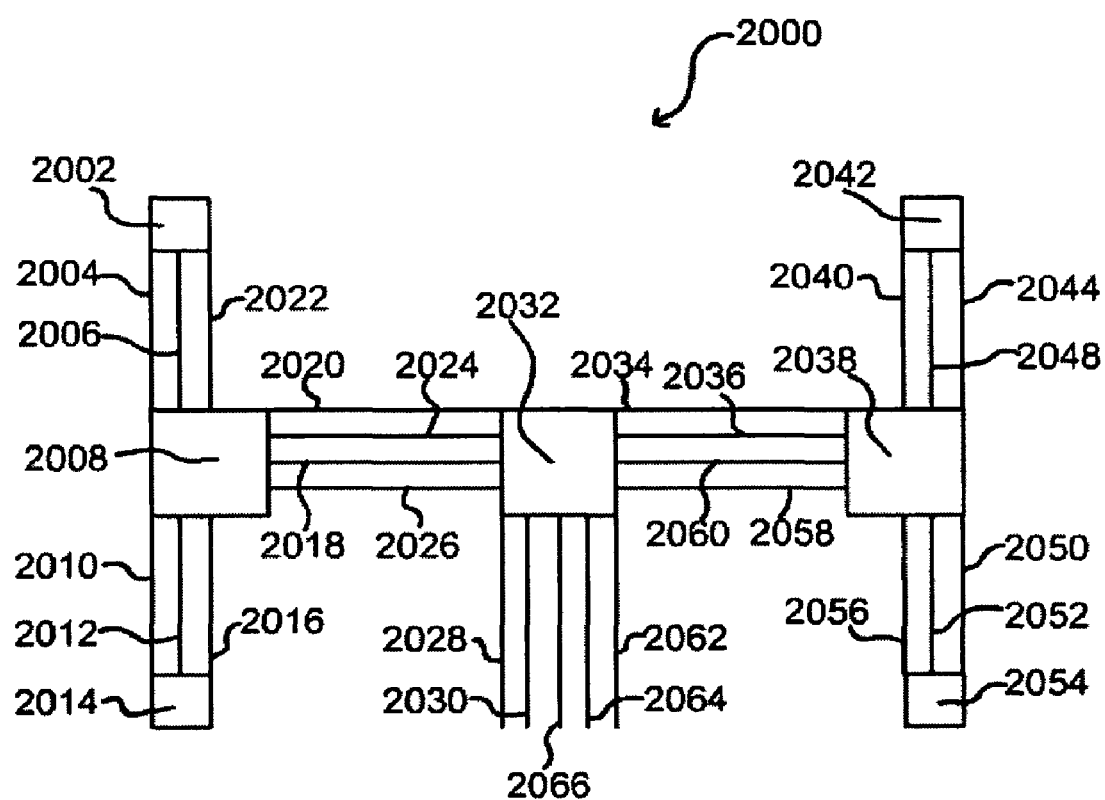
FIG. 20 illustrates a diagram of a fractal branch router system that can be implemented in accordance with a preferred embodiment.

FIG. 20 illustrates a diagram of a fractal memory system 2000 that can be implemented in accordance with a preferred embodiment. System 2000 generally includes a plurality of object circuits 2002, 2014, 2042, 2054 and router circuits 2008, 2032, and 2038. Electrodes 2004, 2006, 2022 can be connected to object circuits 2002 and router circuit 2008. In a similar manner, electrodes 2010, 2012 and 2016 can be connected to object circuit 2014 and router circuit 2008. Electrodes 2040, 2048 and 2044 can be connected to object circuit 2042 and router circuit 2038. Electrodes 2056, 2052 and 2050 can be connected to object circuit 2054 and router circuit 2038. Electrodes 2020 2024, 2018 and 2026 are connected to router circuits 2008 and 2032.

Electrodes 2034 2036, 2060 and 2058 are connected to router circuits 2032 and 2038. In addition, interface electrodes 2028, 2030, 2066, 2064 and 2062 may be connected to router circuit 2032. As indicated in FIG. 20, each object circuit can contain a plurality of electrodes that exceed the number of electrodes necessary to address an object circuit (i.e. 1). The extra electrodes can be used to send and receive information to and from the object circuits. For example, there are two branching router circuits depicted in FIG. 20. To relay information to one of the object circuits, a minimum of two electrodes may be utilized to encode the object circuit address. The resulting bits can be used as a data path for a computation. Based on the configuration illustrated in FIG. 20, two bits can be used for input data calculations and two bits for the address. As an example, consider the simple case where each object circuit in FIG. 20 contains a logic gate, as illustrated in FIG. 21.

Figure 21:
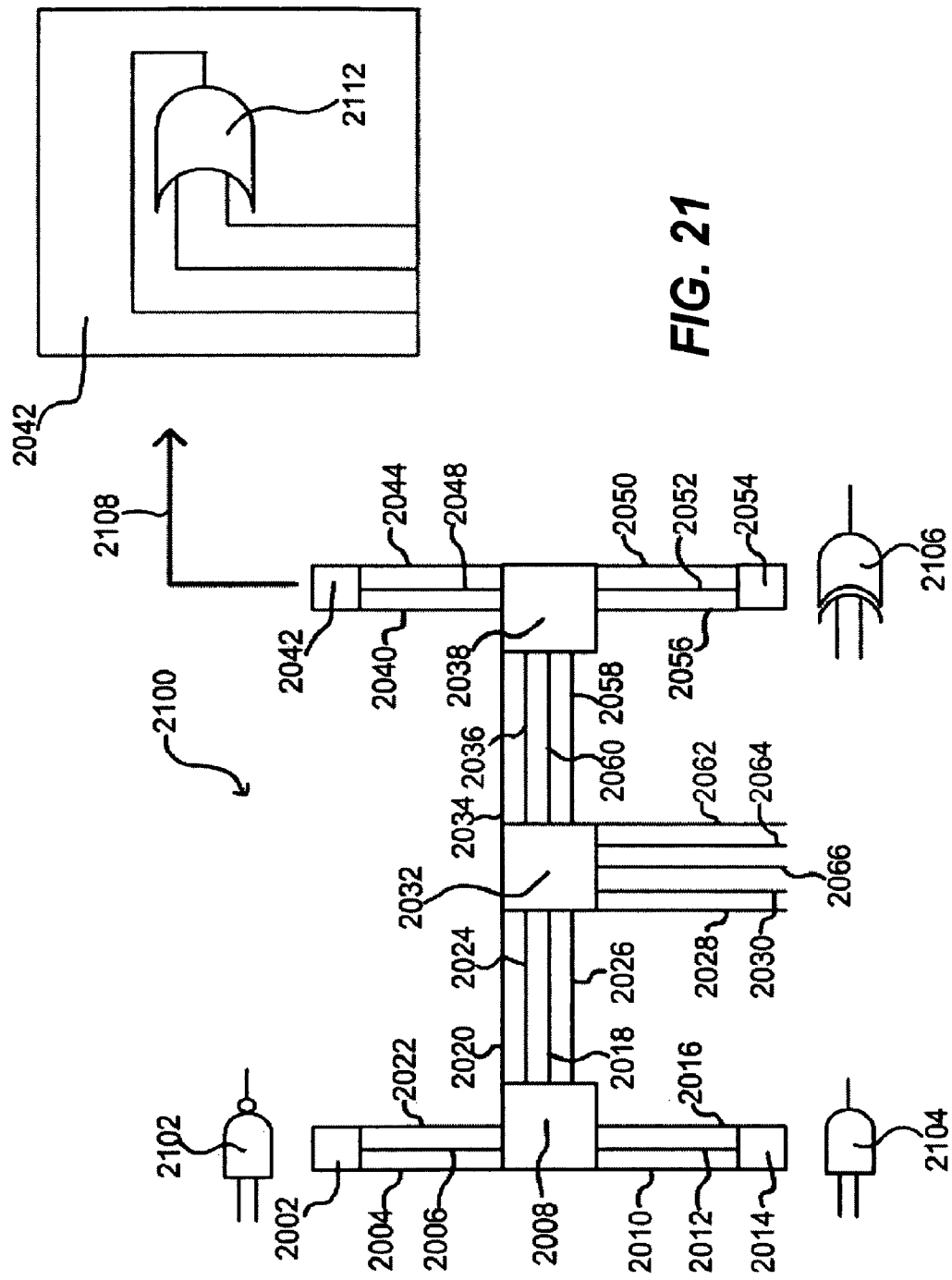
FIG. 21 illustrates a high-level diagram of a fractal router system that can be implemented in accordance with another embodiment.

FIG. 21 illustrates a high-level diagram of a fractal memory system 2100 that can be implemented in accordance with another embodiment. Note that in FIGS. 20-21, identical or similar parts or elements are indicated by identical reference numerals. System 2100 thus incorporates system 2000 and a plurality of logic gates 2102, 2104, and 2106. Data can be output from object circuit 2042, which can include a logic gate 2112 which may be, for example, an "OR" logic gate.

Assuming that one desires to "OR" two or more input lines, the input lines can be routed to an "OR" object circuit such as logic component 2112 by including a circuit address. For example, one can input [Z1010], where "Z" indicates a floating value. This input can be broken down into its component form: [output][input][address].

When the input is applied, the signal will be routed to the OR gate and the inputs [10] will be provided to the circuit. The output of the circuit can then be read on the output line. In this manner, it can be seen that a fractal architecture can be utilized to route an input, and receive and output from, any circuit on the fractal tree. By increasing the complexity of the fractal tree it is not difficult to see how such an architecture can be utilized as a basis for networking microprocessors. As the number bits required for input and output grow, the size of the router circuitry will of course grow as well.

Figure 22:
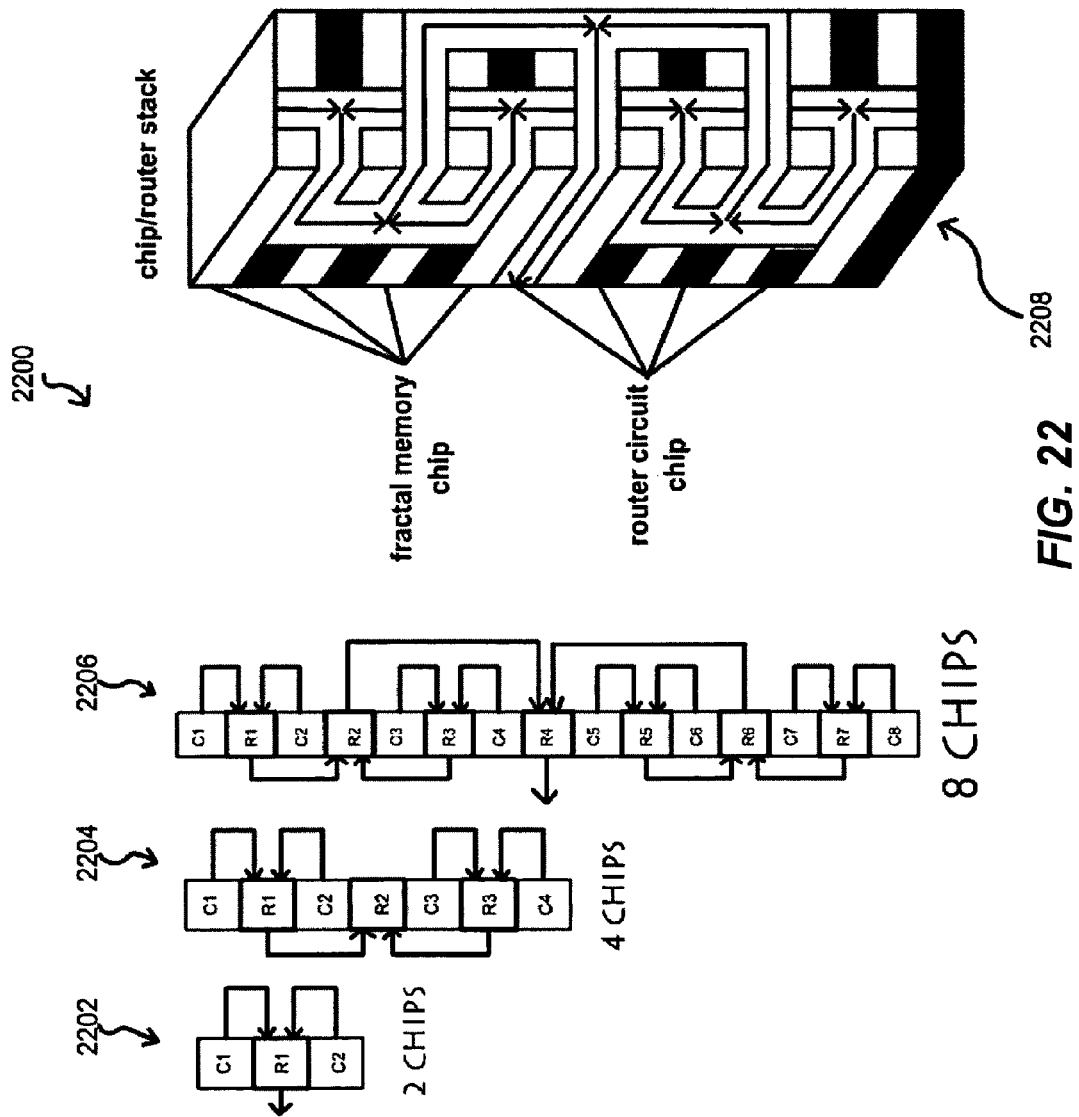
FIG. 22 illustrates a high-level diagram of a chip-stacking procedure that can be implemented in accordance with a preferred embodiment.

For modern microprocessor architectures it is advantageous to provide the capability of at least 64 bit processing. As an illustrative example, the trunk electrode would thus contain two 64 bit input busses, one 64 bit output bus and associated address bits. Although these inputs can be easily configured on one chip in the same format as outline in this document, it would be advantageous to create a structure where an unlimited number of circuits can be connected to one another. This is easily possible by making each object circuit, or a portion of the fractal tree, contained on one chip and stacking the chips between router circuitry. This can be seen in FIG. 22, which illustrates a high-level diagram of a fractal memory system 2200 that can be implemented in accordance with a preferred embodiment.

System 2200 is based on a chip stacking configuration. In the example depicted in FIG. 22, a two chip configuration 2202 is illustrated along with a four-chip configuration 2204 and an eight-chip configuration 2206. A chip/router stack 2208 can thus be formed that includes one or more stacked fractal chips and one or more stacked router chips. By providing an input to this structure and an address for an object circuit, the input can be routed to the corresponding address and the output will appear at the output bus. Information can be broadcast simultaneously to all fractal memory chips through the router chips and the best-match object circuit address can be broadcast back through the router chips to the address. This type of chip stacking makes it possible to add a virtually unlimited number of chips to the fractal tree described herein.

Figure 23:
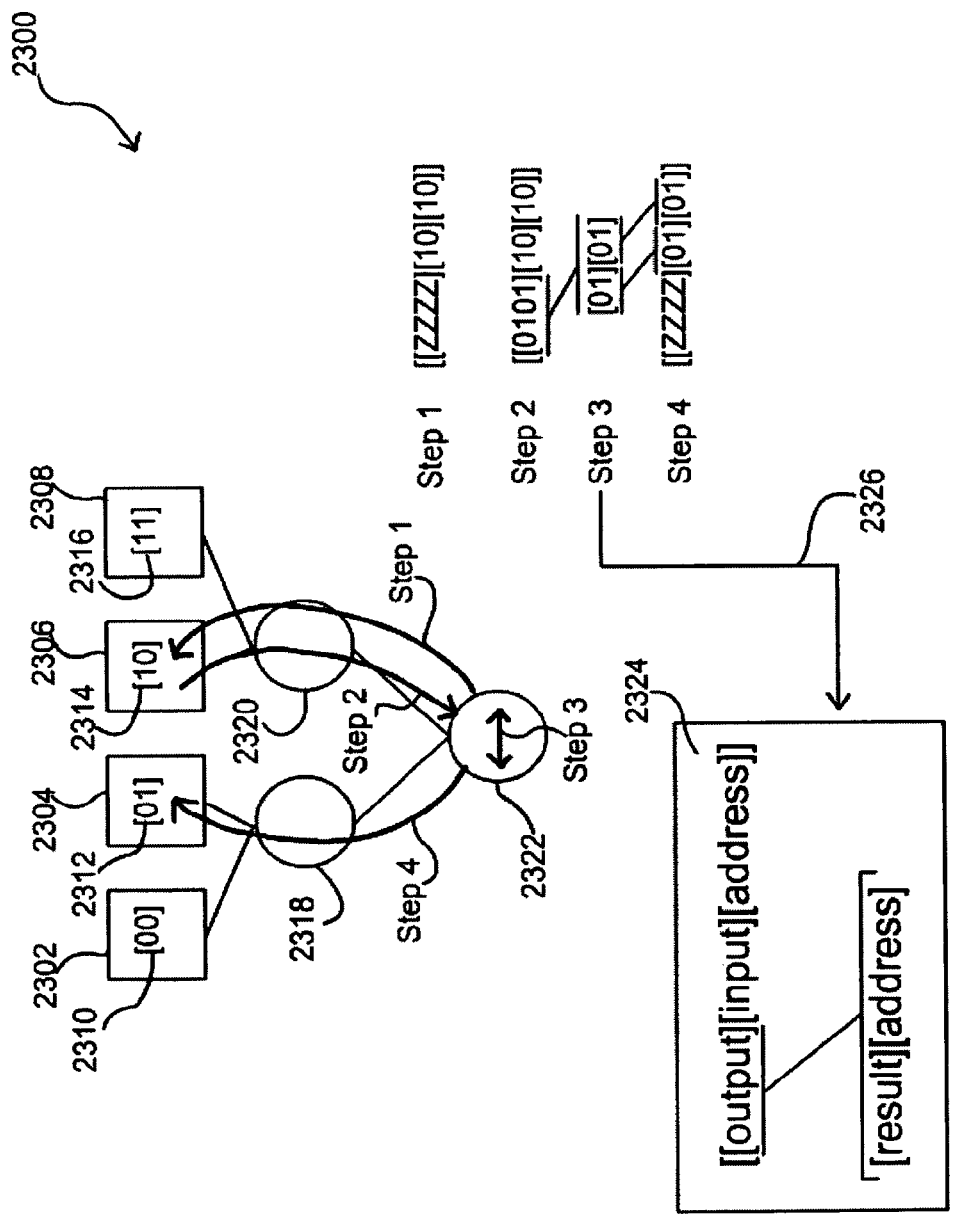
FIG. 23 illustrates a procedure for object-circuit to object-circuit communication in accordance with a preferred embodiment.

FIG. 23 indicates that yet another possibility within fractal memory architecture disclosed herein involving sending information from one object circuit to another object circuit. Recall that the output of an object circuit can result in its address at the output trunk, and that the address, when provided at the truck, can result in the routing of a signal to the object circuit. This property can be exploited in order to send a signal from one object circuit to another object circuit. Recall that one can encode a calculation to be performed by specifying the address of the circuit and providing the input. The signal can be routed to the object circuit specified by the address and the output will be available at the output electrodes. The assignment of the input/output trunk electrodes may therefore be: [outputs][inputs][address]. When the output is attained at the fractal truck, one can perform a simple operation of replacing the input and address bits with the output bits. Such a procedure is depicted as steps 1-4 in FIG. 23

FIG. 23 contains a generalized representation of object circuits 2302, 2304, 2306 and 2308 as well as their fractal addresses 2310, 2312, 2314 and 2316. In addition, router circuitry 2318, 2320, and 2322 is generally depicted at the fractal branch locations. In step 1 an input is applied to the truck input electrodes. As depicted in block 2324, the assignment of electrodes may be given as [[output][input][address]], where "output" is the output of the object circuit given by "address" when given the "input" data. As outlined in FIG. 23, one example is [[zzzz][10][10]], where "z" represents a floating voltage value.

Step 2 comprises the voltage on the output electrode being driven by the result of the logical calculations performed at the object circuit specified by the address. For illustrative purposes this logic calculation can comprise a logical "OR" operation. The output electrodes would thus equal [01xx], where [01] is the result of the operation and "xx" indicates the address of an object circuit, which may comprise any potential object circuit. In the example given the address is [01] which indicates object circuit 2304. Step 3, as detailed by block 2324, illustrates the process of using the output obtained in step 2 as the input and address for step 4. In this way, the output from object circuit 2308 is sent as an input to object circuit 2304.

FIG. 23 thus indicates that by providing a simple transformation of the output vector, it is possible to extract the address of a new object circuit from the output of the previous object circuit and provide the new object circuit with the data obtained from the previous object circuit. In this manner it is possible to send data from one object circuit to another object circuit and perform finite-state machine calculations. One can certainly see the implications with respect to distributed computing and particularly to the implementation of object-oriented programs. In the particular example depicted in FIG. 23, each object defined in a programming language may be mapped to an object circuit in this structure.

Because the chips can be combined in a fractal tree in an infinitely scalable architecture, this opens up the possibility of constructing infinitely scalable distributed computing system, where each object circuit is in fact a microprocessor. Alternately, the system itself can comprise a microprocessor and object circuits representing specialized logical operations required for more efficient calculations.

In the same manner that the fractal memory system previously disclosed utilized Knowm™ synapses formed on the surface of the chip to store information, these chips can store memory on the surface of the chip with a cross-bar of molecular switches. Each object circuit can then store many gigabits or perhaps even terabits of information for use in data processing. It can be appreciated that this form of computing architecture is not of course limited to advanced molecular switch or Knowm™ synapse implementations and can in fact be configured with currently available micro fabrication technology.

Figure 24:
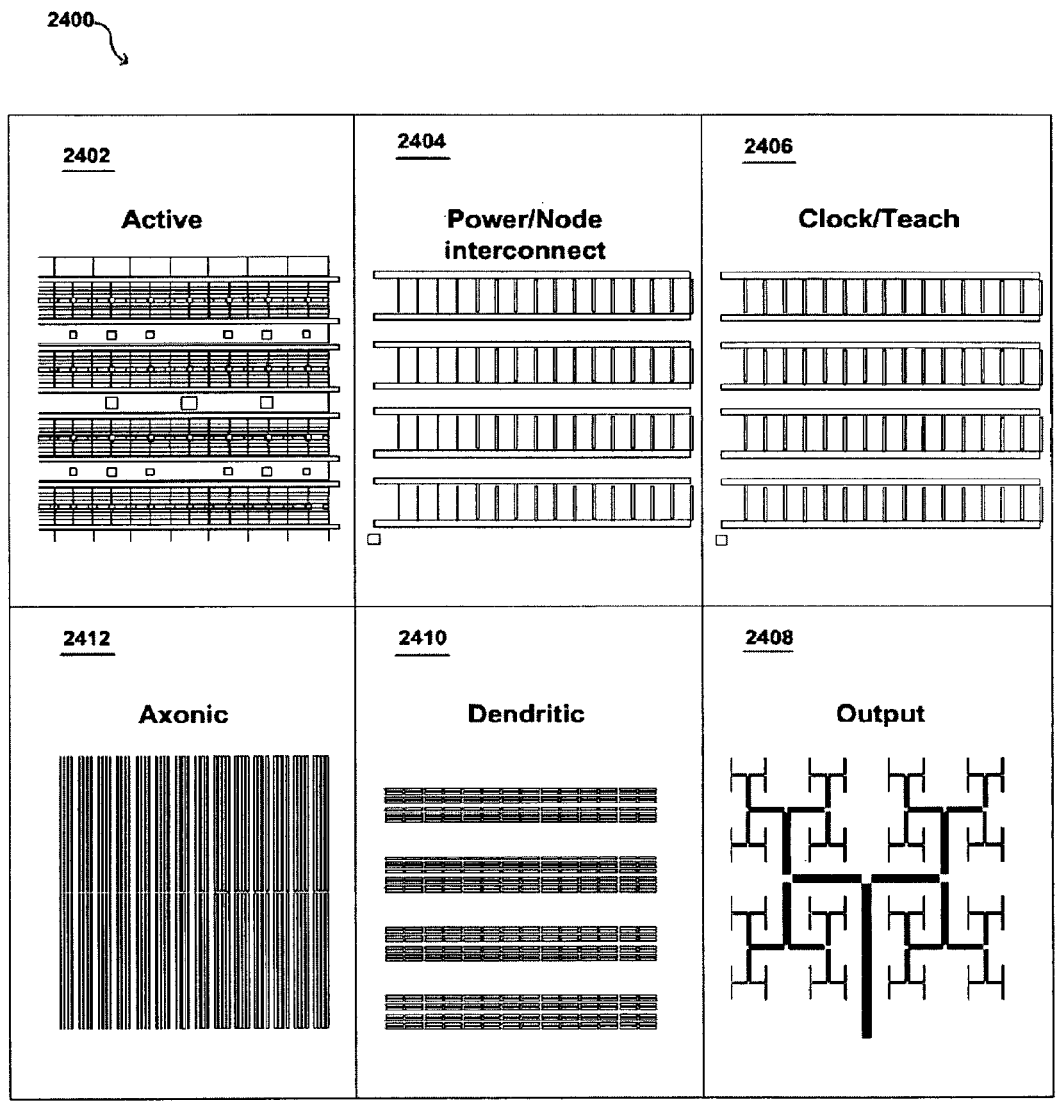
FIG. 24 illustrates a diagram depicting a plurality of chip layers comprising a fractal memory apparatus in accordance with a preferred embodiment.

FIG. 24 illustrates a diagram depicting a plurality of chip layers comprising a fractal memory apparatus in accordance with a preferred embodiment. FIG. 24 illustrates for clarity the various layers that may be used to construct one potential fractal memory apparatus. As depicted by layers 2400, the chip may be composed of 6 basic layers. For the purpose of clarity various insulating and inter-layer connections have been left out. Layers 2400 are meant as a general guide to the construction of a fractal memory apparatus and may be interchanged or replaced without deviating from the descriptions set forth. The active chip layer, as depicted by layer 2402, may comprise the lower most level and include transistor building blocks for object, buffer and routing circuitry.

The first metal layer, as indicated by layer 2404 can form the object and router circuit interconnect as well as a power distribution layer. The second metal layer, as depicted by layer 2406 may comprise a clock and teach signal distribution layer, as well provide for object and router circuit interconnects. The third metal layer 2408, as depicted in layer 2408 may comprise an output layer as well as object and router circuit interconnect. Metal layer four, as depicted by layer 2410, may provide for dendritic electrodes, as well as power, clock and teach signal distribution. Metal layer five, as depicted by layer 2412, may comprise the axonic or input distribution layer.

A number of applications are thus possible based on the foregoing embodiments. Arbitrary circuit blocks may also be implemented in the context of the fractal architecture described herein. Such an architecture makes it possible to scale a system upward indefinitely by adding additional components to the utilized fractal tree. The resulting fractal structure provides a number of enhancements, particularly in respect to a pattern-recognition embodiment. For example, if it is desired to search a larger database of patterns, two chips and a router chip can be utilized to essentially configure a chip-router-chip "sandwich". Hence, both chips can be searched simultaneously. If four times the number of patterns is required to be searched, two "sandwiches" can be stacked together with a router chip and so forth.

It should be appreciated that an artificial synapse or artificial synapses as contemplated for use in the architecture and methods/systems described herein may be implemented from a variety of different types of synapse configurations currently available in the art or developed in the future. Therefore the current architecture is not limited to a specific type of artificial synapse, but the general use of an artificial synapse is contemplated. For example, the Knowm™ type synapse disclosed herein represents merely one possible type of synapse that may be utilized in accordance with the disclosed embodiments. Synapses based on other types of architectures and configurations can be configured for use with the disclosed embodiments.

It will be further appreciated that variations of the above-disclosed and other features and functions, or alternatives thereof, may be desirably combined into many other different systems or applications. Various modifications, variations or improvements therein may be subsequently made by those skilled in the art, which are also intended to be encompassed by the following claims.

The embodiments of an invention in which an exclusive property or right is claimed are defined as follows:

1. A fractal memory apparatus comprising:
   at least one fractal memory chip comprising at least one fractal tree; and
   at least one router circuit chip, wherein said at least one fractal memory chip communicates electronically with said at least one router chip, said at least one fractal memory chip and said at least one router chip arranged in a chip/router stack structure; and
   at least one object circuit present in said chip/router stack structure, wherein said at least one object circuit communicates electronically with said at least one fractal tree, wherein said at least one object circuit comprises at least one synaptic component that communicates electronically with said at least one fractal tree, said at least one synaptic component having nanoparticles disposed in a solution, said nanoparticles electromechanically arranged to form at least one physical neural connection thereof; and
   at least one object circuit associated with said fractal tree, said at least one object circuit configured from a plurality of circuits that include meta-stable switches, wherein data transmitted to said at least one object circuit configured from a plurality of circuits that include said meta-stable switches is utilized to provide feedback to said meta-stable switches in an Anti-Hebbian and Hebbian manner.

2. The apparatus of claim 1 wherein said at least one object circuit further comprises an arbitrary logical circuit.

3. The apparatus of claim 1 wherein said at least one object circuit further comprises a microprocessor.

* * * * *